US012356769B2

(12) United States Patent
Choi et al.

(10) Patent No.: US 12,356,769 B2
(45) Date of Patent: Jul. 8, 2025

(54) DISPLAY DEVICE

(71) Applicant: Samsung Display Co., LTD., Yongin-si (KR)

(72) Inventors: Hae Yun Choi, Hwaseong-si (KR); Jin Taek Park, Seoul (KR); Ki Seong Seo, Seoul (KR); Dae Ho Song, Hwaseong-si (KR); So Young Yeo, Suwon-si (KR); So Yeon Yoon, Uijeongbu-si (KR); Byeong Hwa Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 423 days.

(21) Appl. No.: 17/660,591

(22) Filed: Apr. 25, 2022

(65) Prior Publication Data

US 2022/0352428 A1    Nov. 3, 2022

(30) Foreign Application Priority Data

Apr. 30, 2021    (KR) .................. 10-2021-0056711

(51) Int. Cl.
*H01L 33/50* (2010.01)
*H01L 33/60* (2010.01)
(Continued)

(52) U.S. Cl.
CPC ...... *H10H 20/8512* (2025.01); *H10H 20/856* (2025.01)

(58) Field of Classification Search
CPC ....... H01L 33/502; H01L 33/60; H01L 33/44; H01L 33/504; H01L 33/58;
(Continued)

(56) References Cited

U.S. PATENT DOCUMENTS 10,923,538 B2   2/2021   Lee et al.
11,038,151 B2   6/2021   Ju et al.
(Continued)

FOREIGN PATENT DOCUMENTS

| CN | 112151567 A | * 12/2020 | ........... H01L 27/156 |
|----|----|----|----|
| JP | 2020-181980 A | 11/2020 | |

(Continued)

OTHER PUBLICATIONS

Korean Office Action issued in corresponding Application No. KR 10-2021-0056711, dated Jan. 22, 2025, 7 pages.

*Primary Examiner* — Tong-Ho Kim
(74) *Attorney, Agent, or Firm* — Womble Bond Dickinson (US) LLP

(57) ABSTRACT

A display device includes a substrate, a partition wall on the substrate, a light-emitting element in an emission area partitioned by the partition wall on the substrate, and extending in a thickness direction of the substrate, a wavelength conversion layer over the light-emitting element in the emission area, and including a base resin, and a scatterer dispersed in the base resin and that converts a wavelength of light emitted from the light-emitting element, a light-blocking member on the partition wall, and at least one optical pattern on the wavelength conversion layer in the emission area, and having an upwardly protruding shape.

19 Claims, 26 Drawing Sheets

(51) Int. Cl.
*H10H 20/851* (2025.01)
*H10H 20/856* (2025.01)

(58) Field of Classification Search
CPC ... H01L 25/0753; H01L 27/156; H01L 33/46; H01L 33/505; H01L 33/54; H01L 33/62; H01L 33/50; H01L 2933/0091; G02B 5/201
USPC .......................................................... 257/79
See application file for complete search history.

(56) References Cited

U.S. PATENT DOCUMENTS

| | | | |
|---|---|---|---|
| 11,462,522 B2 | 10/2022 | Mun et al. | |
| 11,605,677 B2 | 3/2023 | Lee et al. | |
| 11,983,350 B2 | 5/2024 | Kang et al. | |
| 2021/0005583 A1* | 1/2021 | Iguchi | H01L 33/62 |
| 2021/0151422 A1* | 5/2021 | Iguchi | H01L 33/0095 |

FOREIGN PATENT DOCUMENTS

| | | | |
|---|---|---|---|
| KR | 10-2018-0060816 A | 6/2018 | |
| KR | 10-2018-0118488 A | 10/2018 | |
| KR | 10-2020-0001649 A | 1/2020 | |
| KR | 10-2020-0034896 A | 4/2020 | |
| KR | 10-2020-0056795 A | 5/2020 | |
| KR | 10-2020-0075597 A | 6/2020 | |
| KR | 10-2020-0092533 A | 8/2020 | |
| KR | 10-2020-0121430 A | 10/2020 | |

* cited by examiner (a)

(b)

(c)

(d)

(e)

DISPLAY DEVICE

CROSS-REFERENCE TO RELATED APPLICATION

This application claims priority to, and the benefit of, Korean Patent Application No. 10-2021-0056711 filed on Apr. 30, 2021 in the Korean Intellectual Property Office, the disclosure of which is incorporated herein by reference in its entirety.

BACKGROUND

1. Field

The present disclosure relates to a display device.

2. Description of the Related Art

As the information-oriented society evolves, various demands for display devices are ever increasing. Display devices may be flat panel display devices, such as a liquid-crystal display device, a field emission display device, and a light-emitting display device. Light-emitting display devices may include an organic light-emitting display device including organic light-emitting diodes as the light-emitting elements, may include an inorganic light-emitting display device including inorganic semiconductor elements as the light-emitting elements, and may include a micro-LED display device including a light-emitting diodes as the light-emitting elements.

Recently, a head mounted display including a light-emitting display device has been developed. A head mounted display (HMD) is a glasses-type monitor device providing virtual reality (VR) or augmented reality (AR) that is worn on a user's body in the form of glasses or a helmet to form a focus close to the user's eyes.

A high-resolution micro-LED display panel including micro light-emitting diodes is applied to head mounted displays. A micro light-emitting diode emits light of a single color. Therefore, a micro-LED display panel may include a wavelength conversion layer for converting the wavelength of light emitted from the micro light-emitting diode to represent different colors.

SUMMARY

Aspects of the present disclosure provide a display device that may improve luminous efficiency and reduce or prevent color mixture of lights.

It should be noted that aspects of the present disclosure are not limited to the above, and other aspects of the present disclosure will be apparent to those skilled in the art from the following descriptions.

According to an aspect of the present disclosure, there is provided a display device including a substrate, a partition wall on the substrate, a light-emitting element in an emission area partitioned by the partition wall on the substrate, and extending in a thickness direction of the substrate, a wavelength conversion layer over the light-emitting element in the emission area, and including a base resin, and a scatterer dispersed in the base resin and that converts a wavelength of light emitted from the light-emitting element, a light-blocking member on the partition wall, and at least one optical pattern on the wavelength conversion layer in the emission area, and having an upwardly protruding shape.

A surface height of the light-blocking member may be greater than a surface height of the optical pattern.

A cross-sectional shape of the optical pattern may include a lens shape that is convex upward, wherein an initial angle of the lens shape is about 30 degrees or more.

The display device may further include a color filter on the optical pattern.

A refractive index of the optical pattern may be greater than a refractive index of the color filter.

The color filter may be between the optical pattern and the wavelength conversion layer.

The optical pattern may be in direct contact with the light-blocking member.

A width of the optical pattern may be greater than a distance between the partition wall and an adjacent partition wall.

The partition wall may include a first partition wall including a same material as the light-emitting element.

The light-emitting element may include a first semiconductor layer, an active layer on the first semiconductor layer, and a second semiconductor layer on the active layer.

The first partition wall may include a first subsidiary partition wall including a same material as the first semiconductor layer, a second subsidiary partition wall including a same material as the active layer, and a third subsidiary partition wall including a same material as the second semiconductor layer.

A thickness of the third subsidiary partition wall may be equal to or greater than a thickness of the second semiconductor layer.

The first partition wall further may include a fourth subsidiary partition wall on the third subsidiary partition wall, and including an undoped semiconductor material.

A thickness of the fourth subsidiary partition wall may be greater than a thickness of the second semiconductor layer.

A thickness of the light-blocking member may be less than a thickness of the first subsidiary partition wall, and greater than a thickness of the second subsidiary partition wall.

The partition wall may further include a second partition wall on the first partition wall and including an insulating material, and a third partition wall on the second partition wall and including a conductive material, wherein a thickness of the second partition wall is greater than a thickness of the third partition wall.

The display device may further include a reflective film on side surfaces of the partition wall and on side surfaces of the light-emitting element.

The reflective film may be on side surfaces of the light-blocking member.

According to another aspect of the present disclosure, there is provided a display device including a substrate, a first emission area for emitting a first light, a second emission area for emitting a second light, and a third emission area for emitting a third light, which are in a display area, a partition wall partitioning the first emission area, the second emission area, and the third emission area, a first light-emitting element in the first emission area, a second light-emitting element in the second emission area, and a third light-emitting element in the third emission area, which extend in a thickness direction of the substrate, a filling layer on the first, second, and third light-emitting elements, a light-blocking member on the partition wall, and an optical pattern on the filling layer, and having a refractive index that is different from a refractive index of the filling layer.

The optical pattern may be directly on the filling layer.

The display device may further include a reflective film on side surfaces of the light-blocking member.

The optical pattern may be in direct contact with the light-blocking member.

The details of one or more embodiments of the subject matter described in this specification are set forth in the accompanying drawings and the description below.

According to some embodiments of the present disclosure, light efficiency may be improved and light mixing may be suppressed.

It should be noted that effects of the present disclosure are not limited to those described above, and other aspects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
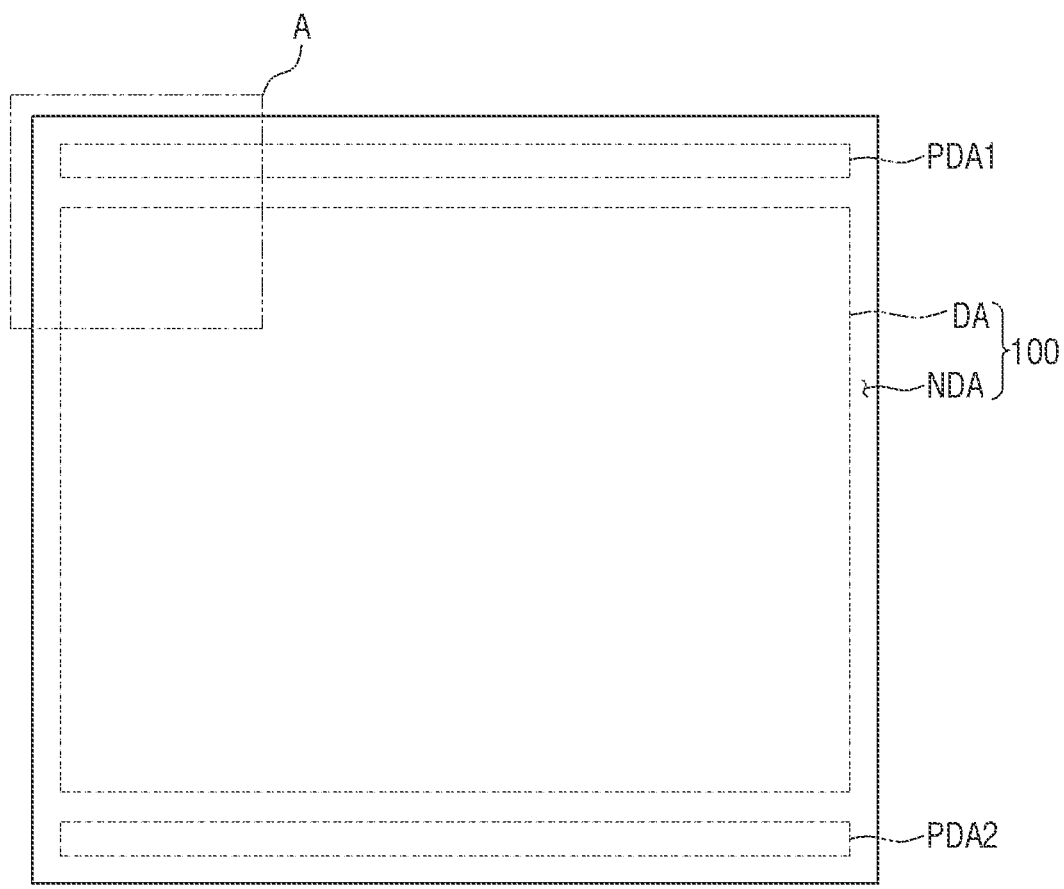
FIG. 1 is a view showing a layout of a display device according to some embodiments of the present disclosure.
Figure 1:
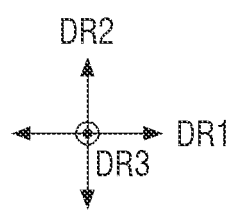

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" may encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it may be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it may be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it may be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
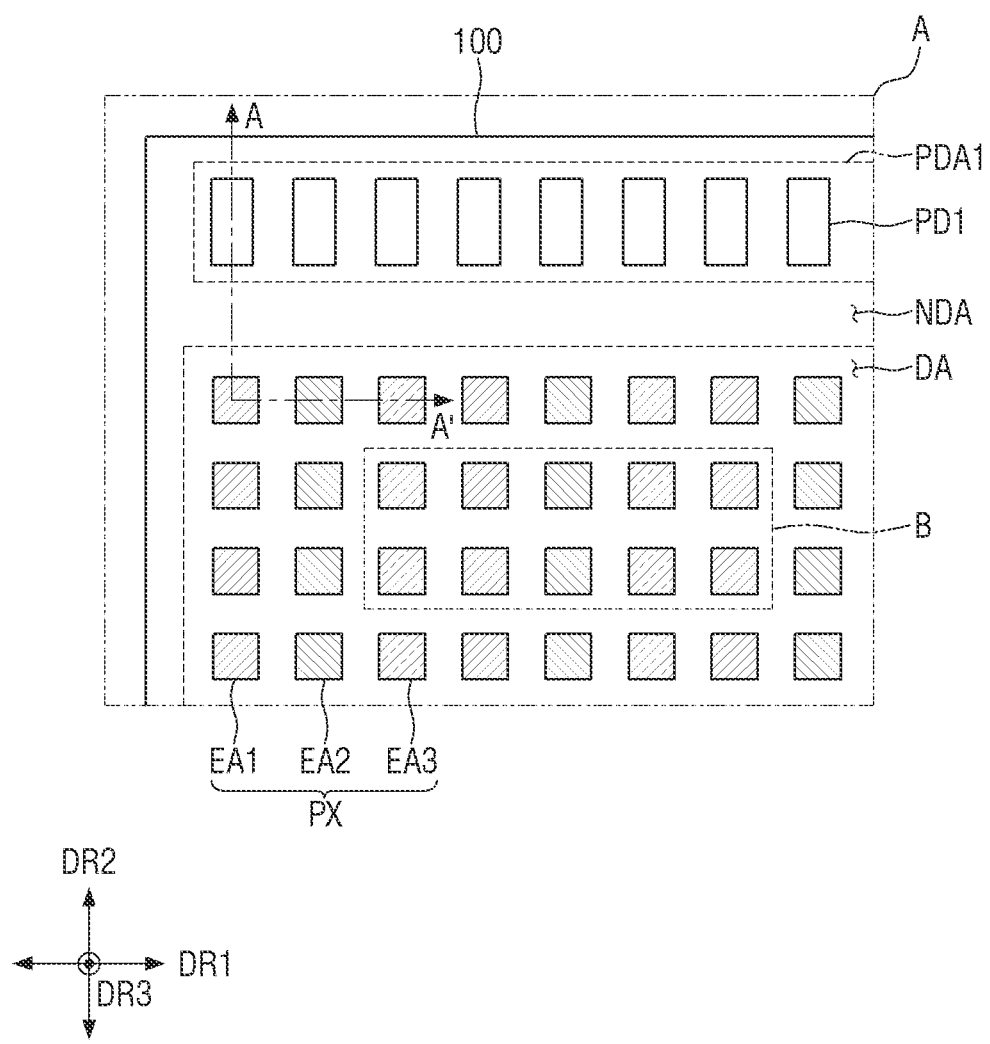
FIG. 2 is a view showing a layout of area A of FIG. 1.
Figure 3:
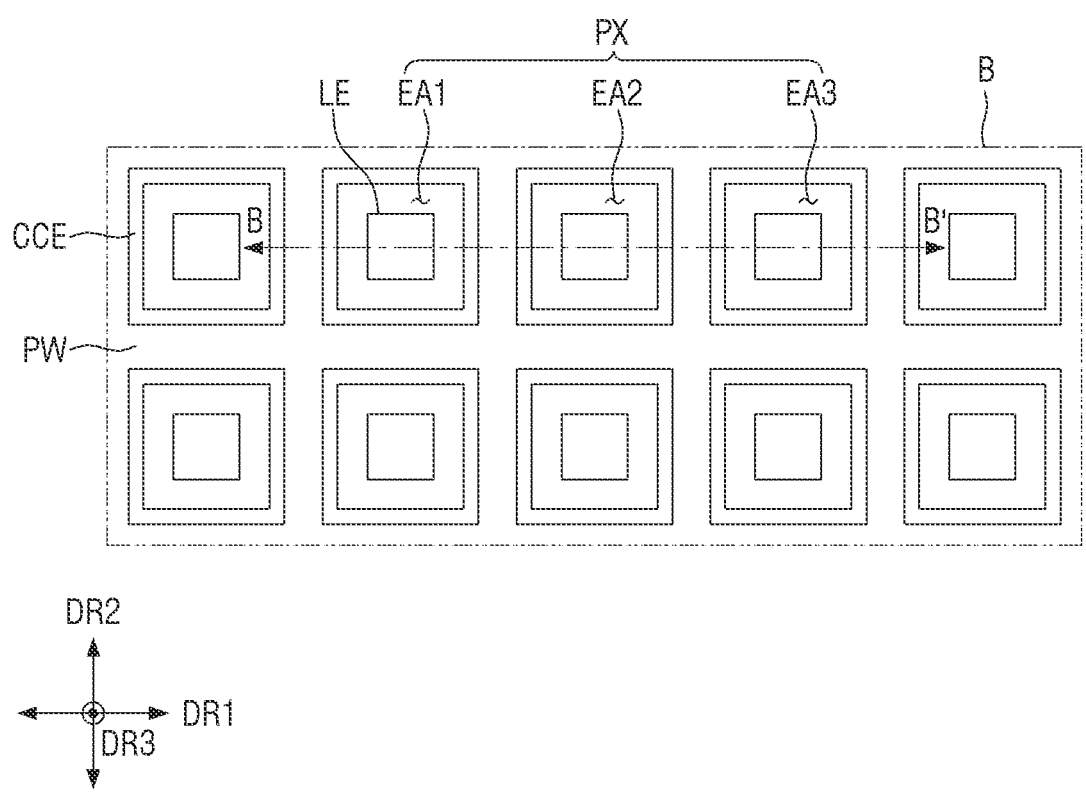
FIG. 3 is a view showing a layout of pixels of a display panel according to some embodiments of the present disclosure.

FIG. 1 is a view showing a layout of a display device according to some embodiments of the present disclosure. FIG. 2 is a view showing a layout of area A of FIG. 1. FIG. 3 is a view showing a layout of pixels of a display panel according to some embodiments of the present disclosure.

In FIGS. 1 to 3, a display device according to some embodiments is a micro light-emitting diode display device including a micro light-emitting diode as a light-emitting element. It should be understood, however, that the present disclosure is not limited thereto.

In addition, in the example shown in FIGS. 1 to 3, the display device according to some embodiments is implemented as a light-emitting diode on silicon (LEDoS) micro-display (e.g., light-emitting diodes are located on a semiconductor circuit board 110 formed via a semiconductor process). It should be understood, however, that embodiments of the present disclosure are not limited thereto.

In FIGS. 1 to 3, a first direction DR1 indicates the horizontal direction of the display panel 100, a second direction DR2 indicates the vertical direction of the display panel 100, and the third direction DR3 refers to the thickness direction of the display panel 100 or to the thickness direction of the semiconductor circuit board 110. As used herein, the terms "left," "right," "upper," and "lower" sides indicate relative positions when the display panel 100 is viewed from the top. For example, the right side refers to one side in the first direction DR1, the left side refers to the other side in the first direction DR1, the upper side refers to one side in the second direction DR2, and the lower side refers to the other side in the second direction DR2. In addition, the upper portion refers to the side indicated by the arrow of the third direction DR3, and the lower portion refers to the opposite side in the third direction DR3.

Referring to FIGS. 1 to 3, a display device 10 according to some embodiments includes a display panel 100 including a display area DA and a non-display area NDA.

The display panel 100 may have a rectangular shape having longer sides in the first direction DR1, and shorter sides in the second direction DR2, when viewed from the top. It should be understood, however, that the shape of the display panel 100 when viewed from the top is not limited thereto. It may have a polygonal, circular, oval, or irregular shape other than the rectangular shape when viewed from the top.

In the display area DPA, images may be displayed. In the non-display area NDA, images might not be displayed. The shape of the display area DA may follow, or correspond to, the shape of the display panel 100 when viewed from the top. In FIG. 1, the display area DA has a rectangular shape when viewed from the top. The display area DA may be generally located at the central area of the display panel 100. The non-display area NDA may be located around the display area DA. The non-display area NDA may surround the display area DA.

The display area DA of the display panel 100 may include a plurality of pixels PX. Each of the pixels PX may be defined as the minimum light-emitting unit for displaying white light.

Each of the pixels PX may include a plurality of emission areas EA1, EA2, and EA3 from which light is emitted. Although each of the plurality of pixels PX includes three emission areas EA1, EA2, and EA3 according to some embodiments of the present disclosure, the present disclosure is not limited thereto. For example, each of the plurality of pixels PX may include four emission areas.

Each of the plurality of emission areas EA1, EA2, and EA3 may include a light-emitting element LE that emits a first light. Although the light-emitting element LE has a square shape when viewed from the top in the example shown, the present disclosure are not limited thereto. For example, the light-emitting element LE may have a polygonal, circular, oval, or irregular shape other than a square shape.

Each of the first emission areas EA1 emits the first light. Each of the first emission areas EA1 may output the first light emitted from the light-emitting element LE as it is. The first light may be light in a blue wavelength range. The blue wavelength range may be approximately about 370 nm to about 460 nm, but embodiments of the present disclosure are not limited thereto.

Each of the second emission areas EA2 emits a second light. Each of the second emission areas EA2 may convert a part of the first light emitted from the light-emitting element LE into the second light to output it. The second light may be light in a green wavelength range. The green wavelength range may be approximately about 480 nm to about 560 nm, but embodiments of the present disclosure are not limited thereto.

Each of the third emission areas EA3 emits a third light. Each of the third emission areas EA3 may convert a part of the first light emitted from the light-emitting element LE into the third light to output it. The third light may be light in a red wavelength range. The red wavelength range may be approximately about 600 nm to about 750 nm, but embodiments of the present disclosure are not limited thereto.

The first emission areas EA1, the second emission areas EA2, and the third emission areas EA3 may be arranged sequentially and repeatedly in the first direction DR1. For example, the first emission areas EA1, the second emission areas EA2, and the third emission areas EA3 may be arranged in the order of the first emission area EMA1, the second emission area EMA2, and the third emission area EMA3 in the first direction DR1.

The first emission areas EA1 may be arranged in the second direction DR2. The second emission areas EA2 may be arranged in the second direction DR2. The third emission areas EA3 may be arranged in the second direction DR2.

The plurality of emission areas EA1, EA2, and EA3 may be partitioned by a partition wall PW. The partition wall PW may be located to surround the light-emitting elements LE. The partition wall PW may be spaced apart from the light-emitting elements LE. The partition wall PW may have a mesh shape, a net shape, or a grid shape when viewed from the top.

Although each of the emission areas EA1, EA2, and EA3 defined by the partition wall PW has a square shape when viewed from the top in the example shown in FIGS. 2 and 3, the present disclosure is not limited thereto. For example, each of the plurality of emission areas EA1, EA2, and EA3 defined by the partition wall PW may have a polygonal, circular, oval, or irregular shape other than a square shape.

A common connection electrode CCE may be located to overlap the partition wall PW in the third direction DR3. The common connection electrode CCE may be located to surround the light-emitting elements LE. The common connection electrode CCE may be spaced apart from the light-emitting element LE. The common connection electrode CCE may have a mesh shape, a net shape, or a grid shape when viewed from the top.

Figure 7:
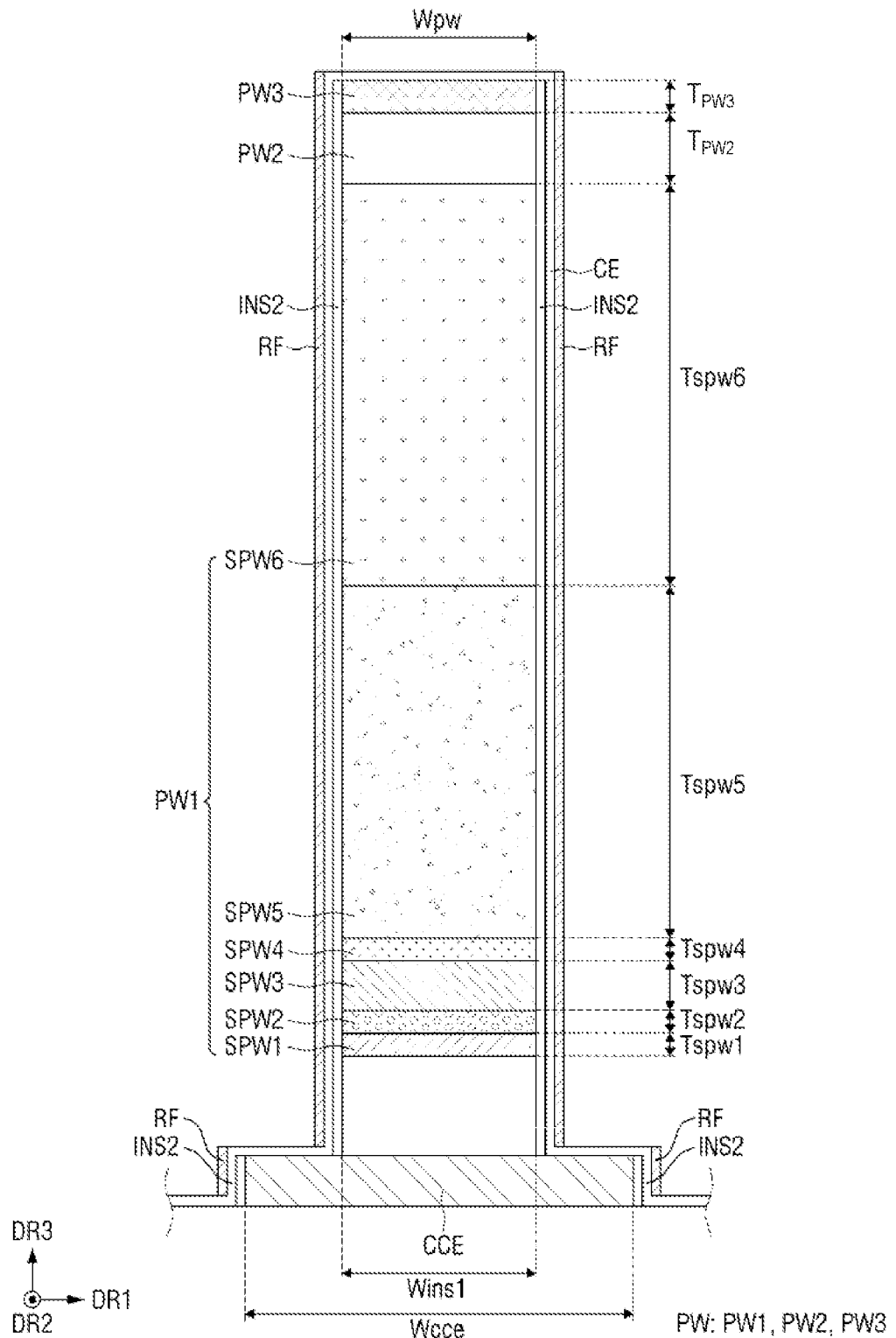
FIG. 7 is an enlarged, cross-sectional view showing in detail an example of the partition wall of FIG. 5.

As shown in FIG. 7, the width $W_{cce}$ of the common connection electrode CCE in the first direction DR1 or the second direction DR2 may be greater than the width $W_{pw}$ of the partition wall PW. The partition wall PW may completely overlap the common connection electrode CCE in the third direction DR3. A part of the common connection electrode CCE may overlap the partition wall PW in the third direction DR3.

The non-display area NDA may include a first pad area PDA1 and a second pad area PDA2.

The first pad area PDA1 may be located in the non-display area NDA. The first pad area PDA1 may be located at the upper portion of the display panel 100. The first pad area PDA1 may include first pads PD1 connected to an external circuit board CB (see FIG. 4).

The second pad area PDA2 may be located in the non-display area NDA. The second pad area PDA2 may be located at the lower portion of the display panel 100. The second pad area PDA2 may include second pads PD2 connected to an external circuit board CB (see FIG. 4). The second pad areas PDA2 may be omitted in some embodiments.

Figure 4:
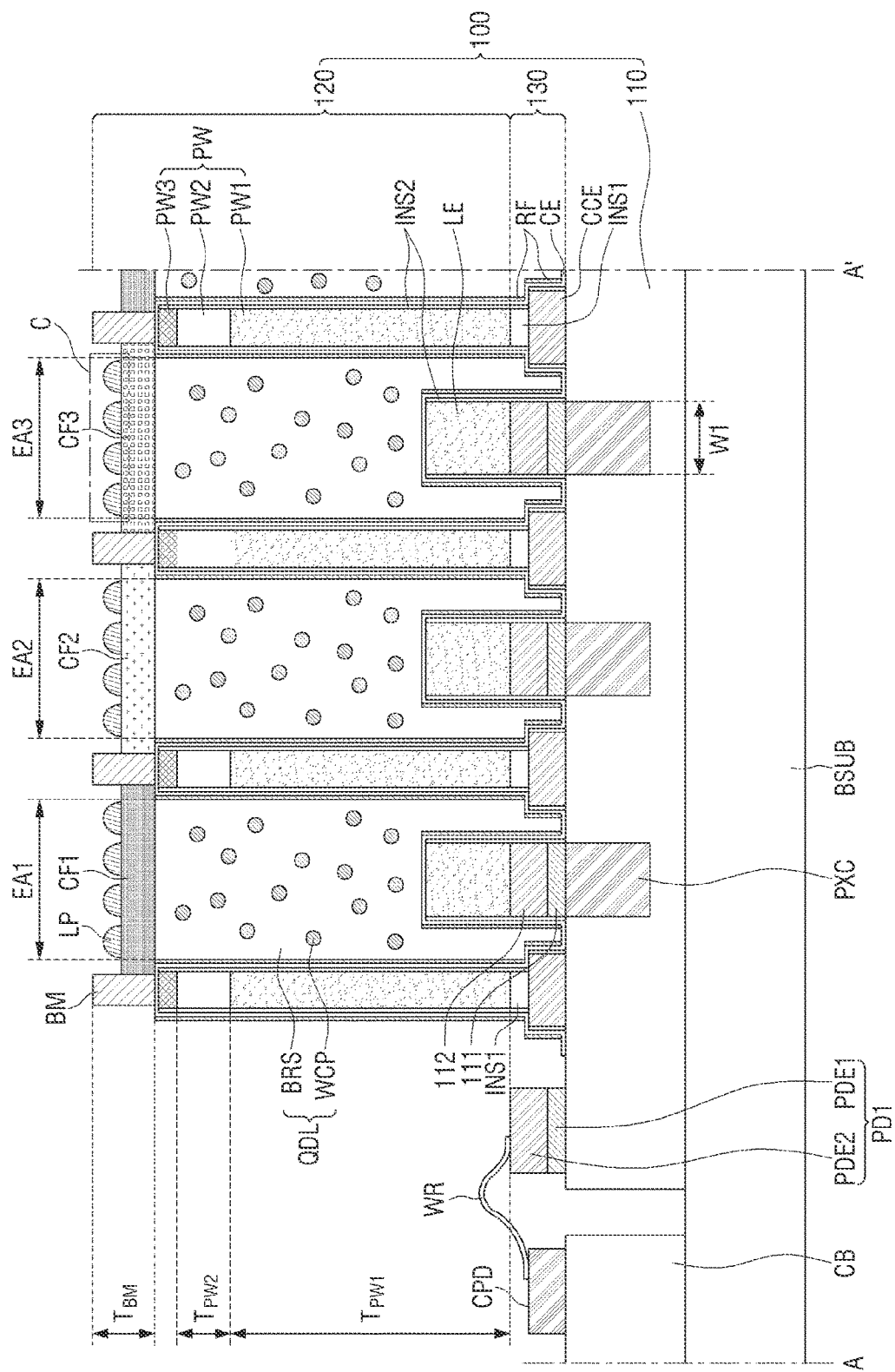
FIG. 4 is a cross-sectional view showing an example of the display panel taken along the line A-A' of FIG. 2.
Figure 5:
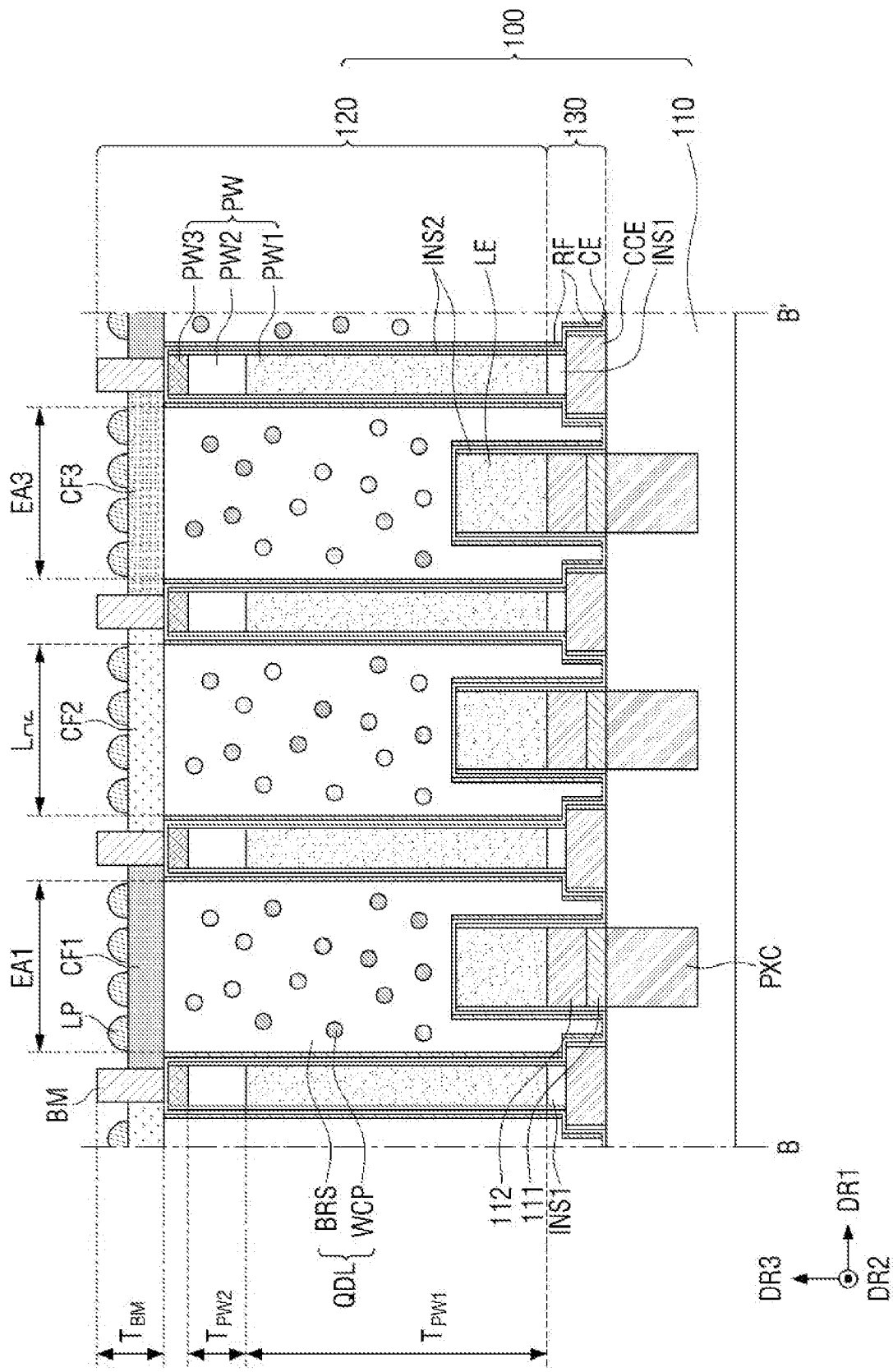
FIG. 5 is a cross-sectional view showing an example of the display panel taken along the line B-B' of FIG. 3.
Figure 6:
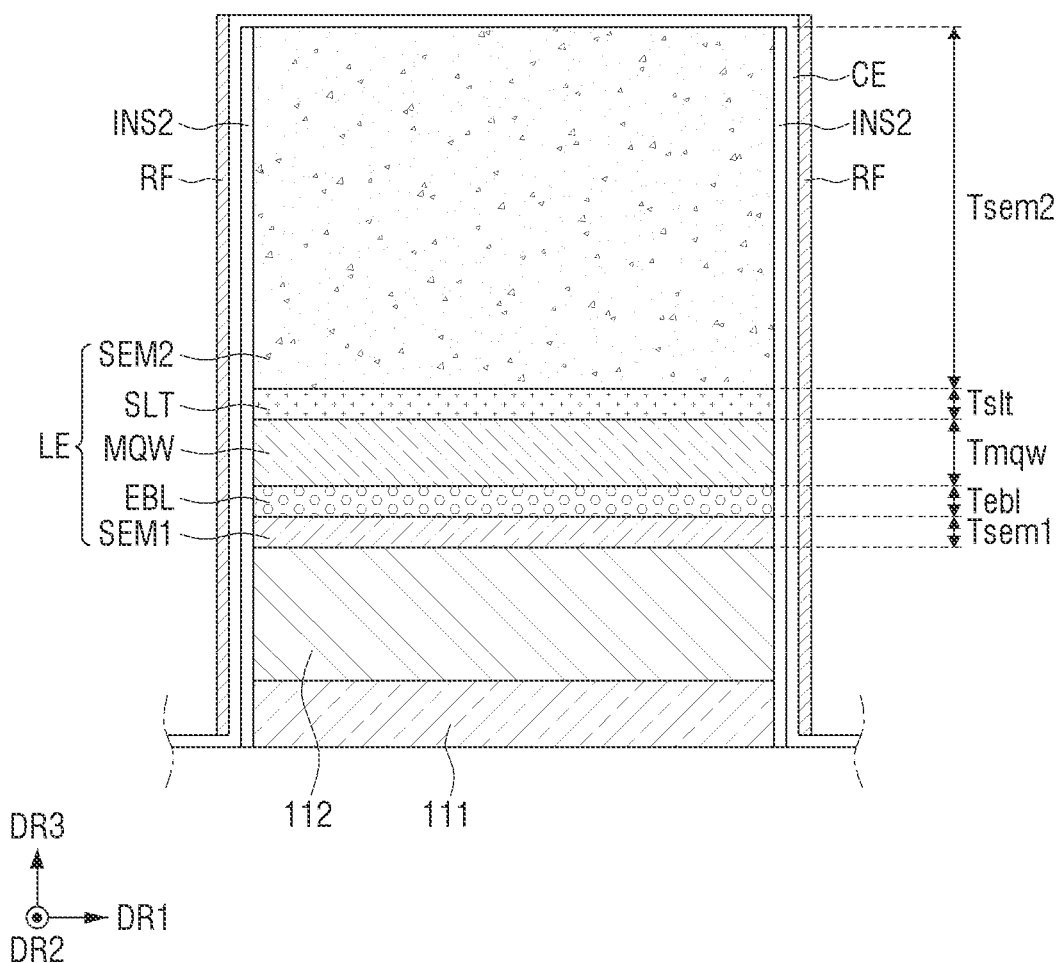
FIG. 6 is an enlarged, cross-sectional view showing in detail an example of the light-emitting element of FIG. 5.

FIG. 4 is a cross-sectional view showing an example of the display panel taken along the line A-A' of FIG. 2. FIG. 5 is a cross-sectional view showing an example of the display panel taken along the line B-B' of FIG. 3. FIG. 6 is an enlarged, cross-sectional view showing in detail an example of the light-emitting element of FIG. 5. FIG. 7 is an enlarged, cross-sectional view showing in detail an example of the partition wall of FIG. 5.

Referring to FIGS. 4 to 7, the display panel 100 may include the semiconductor circuit board 110, a conductive connection layer 130, and a light-emitting element layer 120.

The semiconductor circuit board 110 may include a plurality of pixel circuits PXC and pixel electrodes 111. The conductive connection layer 130 may include connection electrodes 112, first pads PD1, the common connection electrode CCE, a first insulating film INS1, and a conductive pattern 112R.

The semiconductor circuit board 110 may be a silicon wafer substrate formed via a semiconductor process. The plurality of pixel circuits PXC of the semiconductor circuit board 110 may be formed via a semiconductor process.

The plurality of pixel circuits PXC may be located in the display area DA. The plurality of pixel circuits PXC may be connected to the pixel electrodes 111, respectively. In other words, the plurality of pixel circuits PXC and the plurality of pixel electrodes 111 may be connected in a one-to-one correspondence. Each of the plurality of pixel circuits PXC may overlap a corresponding light-emitting element LE in the third direction DR3.

Each of the plurality of pixel circuits PXC may include at least one transistor formed via a semiconductor process. In addition, each of the plurality of pixel circuits PXC may further include at least one capacitor formed via a semiconductor process. Each of the plurality of pixel circuits PXC may apply a pixel voltage or an anode voltage to the pixel electrode 111.

The pixel electrodes 111 may be located on the pixel circuits PXC, respectively. Each of the pixel electrodes 111 may be an exposed electrode that is exposed from the respective pixel circuit PXC. In other words, each of the pixel electrodes 111 may protrude from the upper surface of the respective pixel circuit PXC. The pixel electrodes 111 may be formed integrally with the pixel circuits PXC, respectively. Each of the pixel electrodes 111 may receive a pixel voltage or an anode voltage from the respective pixel circuit PXC. The pixel electrodes 111 may be made of aluminum (Al).

The connection electrodes 112 may be located on the pixel electrodes 111, respectively. Each of the connection electrodes 112 may be located on a corresponding pixel electrode 111. The connection electrodes 112 may include a metal material for attaching the pixel electrodes 111 to the light-emitting elements LE. For example, the connection electrodes 112 may include at least one of gold (Au), copper (Cu), aluminum (Al), and tin (Sn). Alternatively, the connection electrodes 112 may include a first layer including one of gold (Au), copper (Cu), aluminum (Al) and tin (Sn), a second layer including another one of gold (Au), copper (Cu), aluminum (Al), and tin (Sn). In this instance, the second layer may be located on the first layer.

The common connection electrode CCE may be spaced apart from the pixel electrode 111 and the connection electrode 112. The common connection electrode CCE may be located to surround the pixel electrode 111 and the connection electrode 112.

The common connection electrode CCE may be connected to one of the first pads PD1 of the first pad area PDA1, or one of the second pads PD2 of the second pad area PDA2, in the non-display area NDA to receive a common voltage. The common connection electrode CCE may include the same material as the connection electrodes 112. For example, the common connection electrode CCE may include at least one of gold (Au), copper (Cu), aluminum (Al), and tin (Sn). When each of the connection electrodes 112 includes the first layer and the second layer, the common connection electrode CCE may include the same material as the first layer of each of the connection electrodes 112.

The first insulating film INS1 may be located on the common connection electrode CCE. The first insulating film INS1 may be implemented as an inorganic film, such as a silicon oxide film ($SiO_2$), an aluminum oxide film ($Al_2O_3$), and a hafnium oxide film ($HfO_x$). As shown in FIG. 7, the width Wins1 of the first insulating film INS1 in the first direction DR1 or the second direction DR2 may be less than the width $W_{cce}$ of the common connection electrode CCE. Accordingly, a part of the upper surface of the common connection electrode CCE might not be covered by the first insulating film INS1, but instead may be exposed. The part of the upper surface of the common connection electrode CCE that is not covered by the first insulating film INS1, but is exposed, may be in contact with the common electrode CE. Therefore, the common electrode CE may be connected to the common connection electrode CCE.

The conductive pattern 112R may be located on the first insulating film INS1. The conductive pattern 112R may be located between the first insulating film INS1 and the partition wall PW. The width of the conductive pattern 112R may be substantially equal to the width Wins1 of the first insulating film INS1 or the width $W_{pw}$ of the partition wall PW.

The conductive pattern 112R may be residue(s) formed via the process for forming the connection electrodes 112 and the common connection electrode CCE. Therefore, the conductive pattern 112R may include the same material as the connection electrodes 112 and the common connection electrode CCE. For example, the conductive pattern 112R may include at least one of gold (Au), copper (Cu), aluminum (Al), and tin (Sn). When each of the connection electrodes 112 includes the first layer and the second layer, the conductive pattern 112R may include the same material as the second layer of each of the connection electrodes 112.

Each of the first pads PD1 may be connected to a pad CPD of the circuit board CB through a conductive connection member, such as a wire WR associated with it. That is to say, the first pads PD1, the wires WR, and the pads CPD of the circuit board CB may be connected to one another, respectively.

Each of the first pads PD1 may include a first pad electrode PDE1 and a second pad electrode PDE2. The first pad electrode PDE1 may include the same material as the pixel electrode 111. The second pad electrode PDE2 may include the same material as the connection electrodes 112. For example, the second pad electrode PDE2 may include at least one of gold (Au), copper (Cu), aluminum (Al), and tin (Sn). When the connection electrodes 112 include the first layer and the second layer, the second pad electrode PDE2 may also include a first layer and a second layer.

The semiconductor circuit board 110 and the circuit board CB may be located on a base substrate BSUB. The semiconductor circuit board 110 and the circuit board CB may be attached to the upper surface of the base substrate BSUB using an adhesive member, such as a pressure sensitive adhesive.

The circuit board CB may be a flexible film, such as a flexible printed circuit board (FPCB), a printed circuit board (PCB), a flexible printed circuit (FPC), and a chip-on-film (COF).

The second pads of the second pad area PDA2 may be similar or substantially identical to the first pads PD1 described above with reference to FIGS. 4 and 5. Therefore, redundant description thereof will be omitted.

A light-emitting element layer 120 may include the light-emitting elements LE, the partition wall PW, the second insulating film INS2, the common electrode CE, a reflective film RF, a wavelength conversion layer QDL, a plurality of color filters CF1, CF2, and CF3, a light-blocking member BM, and optical patterns LP.

The light-emitting element layer 120 may include first emission areas EA1, second emission areas EA2, and third emission areas EA3 partitioned by the partition wall PW. In each of the first emission areas EA1, the second emission areas EA2, and the third emission areas EA3, one of the light-emitting elements LE, the wavelength conversion layer QDL, the plurality of color filters CF1, CF2, and CF3, and the optical patterns LP may be located.

The light-emitting element LE may be located on the connection electrode 112 in each of the first emission areas EA1, the second emission areas EA2, and the third emission areas EA3. The light-emitting element LE may be a vertical light-emitting diode extended in the third direction DR3. That is to say, the length of the light-emitting element LE in the third direction DR3 may be greater than the length in the horizontal direction. The horizontal length refers to either the length in the first direction DR1 or the length in the second direction DR2. For example, the length of the light-emitting element LE in the third direction DR3 may be approximately about 1 μm to about 5 μm.

The light-emitting element LE may be a micro light-emitting diode. The light-emitting element LE includes a first semiconductor layer SEM1, an electron blocking layer EBL, an active layer MQW, a superlattice layer SLT, and a second semiconductor layer SEM2 in the third direction DR3, as shown in FIG. 6. The first semiconductor layer SEM1, the electron blocking layer EBL, the active layer MQW, the superlattice layer SLT, and the second semiconductor layer SEM2 may be stacked on one another in this order in the third direction DR3.

The first semiconductor layer SEM1 may be located on the connection electrode 112. The first semiconductor layer SEM1 may be doped with a dopant of a first conductivity type such as Mg, Zn, Ca, Se, and Ba. For example, the first semiconductor layer 31 may be p-GaN doped with p-type Mg. The thickness of the first semiconductor layer 31 may range approximately from about 30 nm to about 200 nm.

The electron blocking layer EBL may be located on the first semiconductor layer SEM1. The electron blocking layer EBL may suppress, reduce, or prevent too many electrons from flowing into the active layer MQW. For example, the electron blocking layer EBL may be p-AlGaN doped with p-type Mg. The thickness of the electron blocking layer EBL may be approximately about 10 nm to about 50 nm. The electron blocking layer EBL may be eliminated.

The active layer MQW may be located on the electron blocking layer EBL. The active layer MQW may emit light as electron-hole pairs are combined therein in response to an electrical signal applied through the first semiconductor layer SEM1 and the second semiconductor layer SEM2. The active layer MQW may emit first light having a central wavelength range of about 450 nm to about 495 nm (e.g., light of the blue wavelength range).

The active layer MQW may include a material having a single or multiple quantum well structure. When the active layer MQW includes a material having the multiple quantum well structure, well layers and barrier layers may be alternately stacked on one another in the structure. The well layers may be made of InGaN, and the barrier layers may be made of GaN or AlGaN, but the present disclosure is not limited thereto. The thickness of the well layers may be approximately 1 to 4 nm, and the thickness of the barrier layers may be about 3 nm to about 10 nm.

Alternatively, the active layer MQW may have a structure in which a semiconductor material having a large band gap energy, and a semiconductor material having a small band gap energy, are alternately stacked on one another, and may include other Group III to Group V semiconductor materials depending on the wavelength range of the emitted light. The light emitted by the active layer MQW is not limited to the first light (light in the blue wavelength range). In some implementations, the second light (light in the green wavelength range) or the third light (light in the red wavelength range) may be emitted by the active layer MQW.

The superlattice layer SLT may be located on the active layer MQW. The superlattice layer SLT may relieve stress between the second semiconductor layer SEM2 and the active layer MQW. For example, the superlattice layer SLT may be made of InGaN or GaN. The thickness of the superlattice layer SLT may be approximately about 50 nm to about 200 nm. The superlattice layer SLT may be eliminated.

The second semiconductor layer SEM2 may be located on the superlattice layer SLT. The second semiconductor layer SEM2 may be doped with a dopant of a second conductivity type, such as Si, Ge, and Sn. For example, the second semiconductor layer SEM2 may be n-GaN doped with n-type Si. The thickness of the second semiconductor layer SEM2 may range approximately from about 2 μm to about 4 μm.

The partition wall PW may be spaced apart from the light-emitting element LE located in each of the first emission areas EA1, the second emission areas EA2, and the third emission areas EA3. The partition wall PW may be located to surround the light-emitting element LE located in each of the first emission areas EA1, the second emission areas EA2, and the third emission areas EA3.

The partition wall PW may be located on (e.g., above) the common connection electrode CCE. The width $W_{pw}$ of the partition wall PW in the first direction DR1 and the second direction DR2 may be less than the width $W_{cce}$ of the common connection electrode CCE. The partition wall PW may be spaced apart from the light-emitting elements LE.

The partition wall PW may include a first partition wall (e.g., a first partition wall portion) PW1, a second partition wall (e.g., a second partition wall portion) PW2, and a third partition wall (e.g., a third partition wall portion) PW3.

The first partition wall PW1 may be located on the first insulating film INS1. Because the first partition wall PW1 is formed via the same process with the light-emitting element LE, at least a part of the first partition wall PW1 may include the same material as that of the light-emitting element LE.

The first partition wall PW1 may include a plurality of subsidiary partition walls SPW1, SPW2, SPW3, SPW4, SPW5, and SPW6 sequentially stacked on one another in the third direction DR3. For example, the first partition wall PW1 may include a first subsidiary partition wall SPW1, a second subsidiary partition wall SPW2, a third subsidiary partition wall SPW3, a fourth subsidiary partition wall SPW4, a fifth subsidiary partition wall SPW5, and a sixth subsidiary partition wall SPW6.

The first subsidiary partition wall SPW1 may be made of the same material as the first semiconductor layer SEM1 of the light-emitting element LE. The first subsidiary partition wall SPW1 may be formed via the same process with the first semiconductor layer SEM1 of the light-emitting element LE. The thickness Tspw1 of the first subsidiary partition wall SPW1 may be substantially equal to the thickness Tsem1 of the first semiconductor layer SEM1 of the light-emitting element LE.

The second subsidiary partition wall SPW2 may be made of the same material as the electron blocking layer EBL of the light-emitting element LE. The second subsidiary partition wall SPW2 may be formed via the same process with the electron blocking layer EBL of the light-emitting element LE. The thickness Tspw2 of the second subsidiary partition wall SPW2 may be substantially equal to the thickness Tebl of the electronic blocking layer EBL of the light-emitting element LE. When the electron blocking layer EBL is eliminated, the second subsidiary partition wall SPW2 may also be eliminated.

The third subsidiary partition wall SPW3 may be made of the same material as the active layer MQW of the light-emitting element LE. The third subsidiary partition wall SPW3 may be formed via the same process with the active layer MQW of the light-emitting element LE. The thickness Tspw3 of the third subsidiary partition wall SPW3 may be substantially equal to the thickness Tmqw of the active layer MQW of the light-emitting element LE.

The fourth subsidiary partition wall SPW4 may be made of the same material as the superlattice layer SLT of the light-emitting element LE. The fourth subsidiary partition wall SPW4 may be formed via the same process with the superlattice layer SLT of the light-emitting element LE. The thickness Tspw4 of the fourth subsidiary partition wall SPW4 may be substantially equal to the thickness Tslt of the superlattice layer SLT of the light-emitting element LE.

The fifth subsidiary partition wall SPW5 may be made of the same material as the second semiconductor layer SEM2 of the light-emitting element LE. The fifth subsidiary partition wall SPW5 may be formed via the same process with the second semiconductor layer SEM2 of the light-emitting element LE. During the process of fabricating the display panel 100, the fifth subsidiary partition wall SPW5 is not removed, but a part of the second semiconductor layer SEM2 of the light-emitting element LE is removed. As a result, the thickness Tspw5 of the fifth subsidiary partition wall SPW5 may be equal to or greater than the thickness Tsem2 of the second semiconductor layer SEM2 of the light-emitting element LE.

The sixth subsidiary partition wall rib SPW6 may be implemented as a semiconductor layer that is not doped with a dopant (e.g., an undoped semiconductor layer). For example, the sixth subsidiary partition wall SPW6 may be GaN not doped with a dopant. The thickness Tspw6 of the sixth subsidiary partition wall SPW6 may be greater than the thickness Tsem2 of the second semiconductor layer SEM2 of the light-emitting element LE. The thickness Tspw6 of the sixth subsidiary partition wall SPW6 may be approximately about 2 μm to 3 μm.

The second partition wall PW2 and the third partition wall PW3 may work as a mask for reducing or preventing etching of the first partition wall PW1 during a process of forming the light-emitting element LE and the partition wall PW.

The second partition wall PW2 may be located on the first partition wall PW1. The second partition wall PW2 may be implemented as an inorganic film, such as a silicon oxide film (SiO$_2$), an aluminum oxide film (Al$_2$O$_3$), and a hafnium oxide film (HfO$_x$). The thickness T$_{PW2}$ of the second partition wall PW2 may be approximately about 1 μm to about 2 μm.

The third partition wall PW3 may be located on the second partition wall PW2. The third partition wall PW3 may include a conductive material, such as nickel (Ni). The thickness Tpw3 of the third partition wall PW3 may be approximately about 0.01 μm to about 1 μm.

The second insulating film INS2 may be located on side surfaces of the common connection electrode CCE, side surfaces of the partition wall PW, side surfaces of each of the pixel electrodes 111, side surfaces of each of the connection electrodes 112, and side surfaces of each of light-emitting elements LE. The second insulating film INS2 may be implemented as an inorganic film, such as a silicon oxide film (SiO$_2$), an aluminum oxide film (Al$_2$O$_3$), and a hafnium oxide film (HfO$_x$). The thickness of the second insulating film INS2 may be approximately about 0.1 μm.

The common electrode CE may be located on the upper and side surfaces of each of the light-emitting elements LE and the upper and side surfaces of the partition wall PW (e.g., with the second insulating film INS2 partially therebetween). That is to say, the common electrode CE may be located to cover the upper and side surfaces of each of the light-emitting elements LE and the upper and side surfaces of the partition wall PW.

The common electrode CE may be in contact with the second insulating film INS2 located on the side surfaces of the common connection electrode CCE, the side surfaces of the partition wall PW, the side surfaces of each of the pixel electrodes 111, the side surfaces of each of the connection electrodes 112, and the side surfaces of each of light-emitting elements LE. In addition, the common electrode CE may be in contact with the upper surface of the common connection electrode CCE, the upper surface of each of the light-emitting elements LE, and the upper surface of the partition wall PW.

The common electrode CE may be in contact with the upper surface of the common connection electrode CCE and the upper surface of the light-emitting element LE, which are not covered by the second insulating film INS2. Therefore, the common voltage supplied to the common connection electrode CCE may be applied to the light-emitting element LE. That is to say, a first end of the light-emitting element LE may receive the pixel voltage or the anode voltage of the pixel electrode 111 through the connection electrode 112, and a second end thereof may receive the common voltage through the common electrode CE. The light-emitting element LE may emit light with a luminance (e.g., a predetermined luminance) according to a voltage difference between the pixel voltage and the common voltage.

The common electrode CE may include a transparent conductive material. The common electrode CE may be made of a transparent conductive oxide (TCO), such as indium tin oxide (ITO) and indium zinc oxide (IZO). The thickness of the common electrode CE may be approximately about 0.1 μm.

The reflective film RF serves to reflect some of the lights emitted from the light-emitting element LE that travel in directions that are other than the vertical direction. The reflective film RF may include a metal material having high reflectivity, such as aluminum (Al). The thickness of the reflective film RF may be approximately about 0.1 μm.

The reflective film RF may be located on side surfaces of the common connection electrode CCE, side surfaces of the partition wall PW, side surfaces of each of the pixel electrodes 111, side surfaces of each of the connection electrodes 112, and side surfaces of each of light-emitting elements LE (e.g., with the second insulating film INS2 and the common electrode CE therebetween). The reflective film RF may be in contact with the common electrode CE first on side surfaces of the common connection electrode CCE, side surfaces of the partition wall PW, side surfaces of each of the pixel electrodes 111, side surfaces of each of the connection electrodes 112, and side surfaces of each of light-emitting elements LE.

The wavelength conversion layer QDL may be located on the protective film PTF in each of the first emission areas EA1, the second emission areas EA2, and the third emission areas EA3. The wavelength conversion layer QDL may convert a part of the first light incident from the light-emitting element LE into the fourth light to output it. For example, the fourth light may be light in a yellow wavelength range. The fourth light may include both a green wavelength range and a red wavelength range. In other words, the fourth light may be a mixture of the second light and the third light.

The wavelength conversion layer QDL may include a base resin BRS and wavelength conversion particles WCP. The base resin BRS may include a transparent organic material. For example, the base resin BRS may include an epoxy resin, an acrylic resin, a cardo resin, or an imide resin.

The wavelength conversion particles WCP may convert the first light incident from the light-emitting element LE into the fourth light. For example, the wavelength conversion particles WCP may convert light in the blue wavelength range into light in the yellow wavelength range. The wavelength conversion particles may be quantum dots (QD), quantum rods, fluorescent material, or phosphorescent material. The quantum dots may include IV nanocrystals, II-VI compound nanocrystals, III-V compound nanocrystals, IV-VI nanocrystals, or combinations thereof.

A quantum dot may include a core and a shell overcoating the core. The core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, Fe2O3, Fe3O4, Si, and Ge. The shell may include, but not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

The wavelength conversion layer QDL may further include scatterers for scattering the light of the light-emitting element LE in random directions. The scatterers may include metal oxide particles or organic particles. For example, the metal oxide may be titanium oxide (TiO$_2$), zirconium oxide (ZrO$_2$), aluminum oxide (Al$_2$O$_3$), indium oxide (In$_2$O$_3$), zinc oxide (ZnO), or tin oxide (SnO$_2$). In addition, the organic particles may include an acrylic resin or a urethane-based resin. The diameter of the scatterers may be about several to several tens of nanometers.

The light-blocking member BM may be located on the partition wall PW. The light-blocking member BM may include a light-blocking material. For example, the light-blocking member BM may include, but is not limited to, an organic material or a metal material that may block light. The light-blocking member BM may be located between the adjacent emission areas EA1, EA2, and EA3, and may reduce or prevent color mixing between lights in different wavelength ranges emitted from the light-emitting elements LE of the emission areas EA1, EA2, and EA3. In addition, the light-blocking member BM may absorb at least a part of external light incident from the outside on the light-emitting element layer 120 to reduce reflection of the external light.

The light-blocking member BM may be located in or on the partition wall PW. The width of the light-blocking member BM may be less than the width of the partition wall PW. It should be understood, however, that the present disclosure is not limited thereto. The width of the light-blocking member BM may be equal to the width of the partition wall PW. The light-blocking member BM may be in direct contact with the common electrode CE located on the third partition wall PW3. The thickness $T_{BM}$ of the light-blocking member BM may be designed in consideration of the surface height of the optical patterns LP, which will be described later.

The plurality of color filters CF1, CF2, and CF3 may include first color filters CF1, second color filters CF2, and third color filters CF3.

The first color filters CF1 may be located on the wavelength conversion layer QDL in a corresponding first emission area EA1. In addition, each of the first color filters CF1 may be located on a corresponding partition wall PW. Each of the first color filters CF1 may transmit the first light, and may absorb or block the fourth light. For example, each of the first color filters CF1 may transmit light in the blue wavelength range and may absorb or block light in the green and red wavelength ranges. Therefore, each of the first color filters CF1 may transmit the first light that is not converted by the wavelength conversion layer QDL from among the first lights emitted from the light-emitting elements LE, and may absorb or block the fourth light that is converted by the wavelength conversion layer QDL. Accordingly, each of the first emission areas EA1 may emit the first light.

The second color filters CF2 may be located on the wavelength conversion layer QDL in a corresponding second emission area EA2. In addition, each of the second color filters CF2 may be located on a corresponding partition wall PW. Each of the second color filters CF2 may transmit the second light, and may absorb or block the first light and the third light. For example, each of the second color filters CF2 may transmit light in the green wavelength range, and may absorb or block light in the blue and red wavelength ranges. Therefore, each of the second color filters CF2 may absorb or block the first light that is not converted by the wavelength conversion layer QDL from among the first lights emitted from the light-emitting elements LE. In addition, each of the second color filters CF2 may transmit the second light in the green wavelength range from among the fourth light converted by the wavelength conversion layer QDL, and may absorb or block the third light in the red wavelength range. Accordingly, each of the second emission areas EA2 may emit the second light.

The third color filters CF3 may be located on the wavelength conversion layer QDL in a corresponding third emission area EA3. In addition, each of the third color filters CF3 may be located on a corresponding partition wall PW. Each of the third color filters CF3 may transmit the third light, and may absorb or block the first light and the second light. For example, each of the third color filters CF3 may transmit light in the red wavelength range, and may absorb or block light in the blue and green wavelength ranges. Therefore, each of the third color filters CF3 may absorb or block the first light that is not converted by the wavelength conversion layer QDL from among the first lights emitted from the light-emitting elements LE. In addition, each of the third color filters CF3 may transmit the third light in the red wavelength range from among the fourth light converted by the wavelength conversion layer QDL, and may absorb or block the second light in the green wavelength range. Accordingly, each of the third emission areas EA3 may emit the third light.

In addition, at least a part of the partition wall PW may include the same material as the light-emitting elements LE. That is to say, the partition wall PW may be formed via the same process with the light-emitting elements LE, and thus the fabricating process may be simplified.

The optical patterns LP may be located on the color filters CF1, CF2, and CF3 in the emission areas EA1, EA2, and EA3, respectively. The optical patterns LP may be located directly on the color filters CF1, CF2, and CF3. For example, the optical patterns LP may be located directly on the upper surface of the color filters CF1, CF2, and CF3 (e.g., see the upper surface CF3a of the third color filter CF3 of FIG. 9). The optical patterns LP may have a shape that protrudes upward (e.g., from the wavelength conversion layer QDL toward the color filters CF1, CF2, and CF3). For example, the cross-sectional shape of the optical pattern LP may include a lens shape that is convex upward.

For example, as shown in FIG. 4, there may be a plurality of optical patterns LP. Because the optical patterns LP are located in the emission areas EA1, EA2, and EA3, the width W2 (see FIG. 9) of a single optical pattern LP may be less than the spacing of the partition wall PW. Although the width W2 of the optical pattern LP may be less than the width W1 of the light-emitting element LE, the present disclosure is not limited thereto. The width W2 of the optical pattern LP may be equal to or greater than the width W1 of the light-emitting element LE.

The plurality of optical patterns LP may focus the first to third lights respectively transmitted through the color filters CF1, CF2, and CF3 in the emission areas EA1, EA2, and EA3, respectively. The arrangement of the plurality of optical patterns LP, and the condensing of the first to third lights by the optical patterns LP, will be described with reference to FIGS. 8 and 9.

Figure 8:
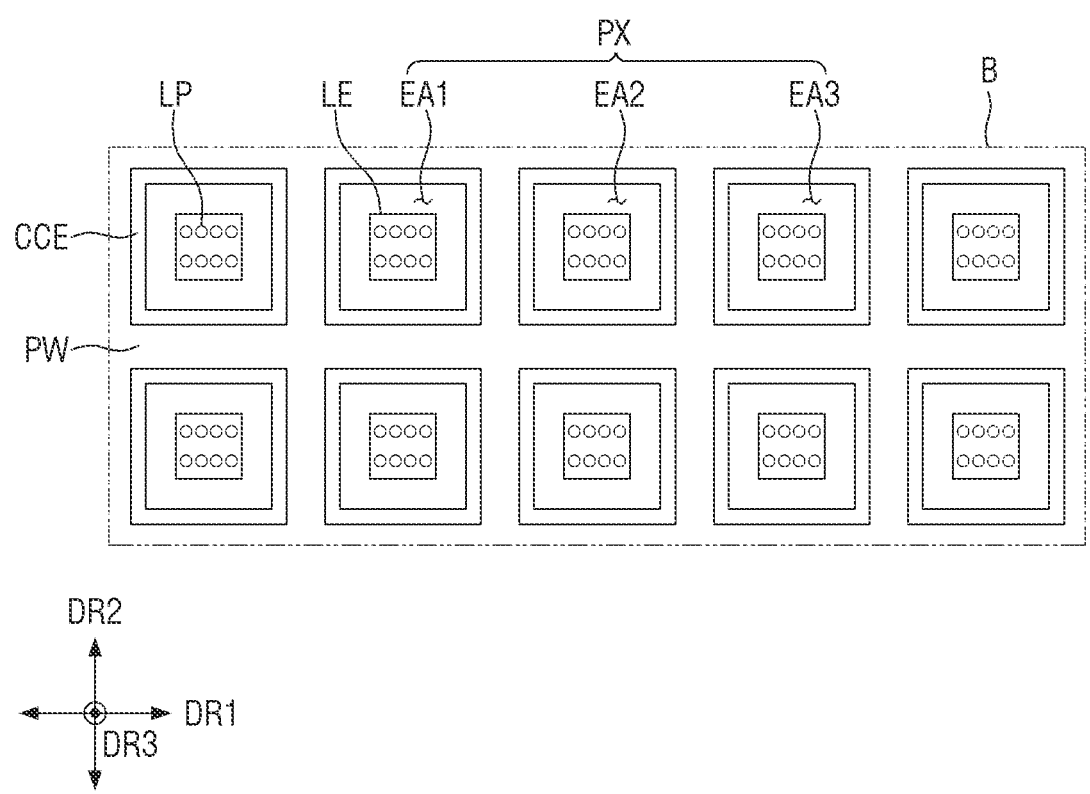
FIG. 8 is a view showing a layout of pixels and optical patterns according to some embodiments of the present disclosure.
Figure 9:
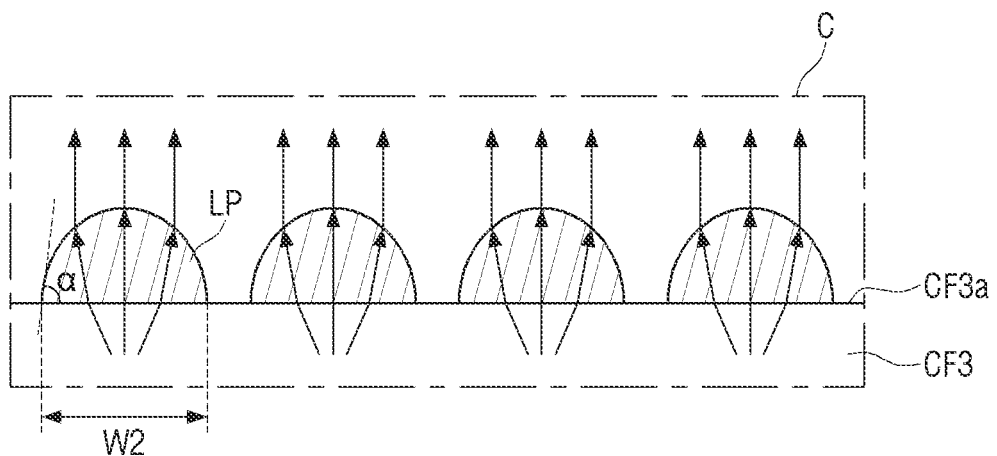
FIG. 9 is an enlarged, cross-sectional view of area C of FIG. 4.

FIG. 8 is a view showing a layout of pixels and optical patterns according to some embodiments of the present disclosure. FIG. 9 is an enlarged, cross-sectional view of area C of FIG. 4.

Initially, referring to FIG. 8, the plurality of optical patterns LP may be respectively located in the emission areas EA1, EA2, and EA3. Although the plurality of optical patterns LP is regularly arranged along the first direction DR1 and the second direction DR2 in the example shown in FIG. 8 for convenience of illustration, the present disclosure is not limited thereto. The plurality of optical patterns LP may be arranged randomly. In FIG. 8, five optical patterns LP are arranged in the first direction DR1 and two optical patterns LP are arranged in the second direction DR2, the number of the plurality of optical patterns LP is not limited thereto.

As mentioned earlier, the plurality of optical patterns LP may focus the first to third lights that pass through the color filters CF1, CF2, and CF3 in the emission areas EA1, EA2, and EA3, respectively. As shown in FIG. 9, the third lights transmitting through the third color filter CF3 may include not only lights traveling straight in the vertical direction, but also lights traveling in directions that are oblique to the vertical direction by corresponding angles. The lights traveling in directions oblique to the vertical direction may be directed by the optical patterns LP so that they travel in directions that are less oblique to the vertical direction.

To direct, by using the optical patterns LP, the lights traveling in directions oblique to the vertical direction by corresponding angles so that the lights travel in directions that are less oblique to the vertical direction, it may be suitable to adjust a difference in the refractive index between the optical patterns LP and the adjacent element, and to adjust the shape of the optical patterns LP.

Initially, the refractive index of the optical patterns LP may be greater than that of the color filter CF3 adjacent to the optical patterns LP. Accordingly, it is possible to focus the lights traveling in directions that are oblique to the vertical direction among the third lights transmitted through the third color filter CF3 at the interface between the optical patterns LP and the color filter CF3 so that the lights travel in directions that are less oblique to the vertical direction (e.g., lights may be focused to the center of the emission area EMA3).

Furthermore, it is possible to focus the third lights transmitted through the color filter CF3 to the general center of the emission area EA3 more reliably only if the refractive index of the optical patterns LP is greater than that of the color filter CF3, and the cross-sectional shape of the optical patterns LP is in the shape of a converging lens that may be used for focusing light. For example, a converging lens may have the initial angle α of 30 degrees or more. Herein, the initial angle may refer to the angle between the tangent line at the point where the lower surface of the optical patterns LP is in contact with the upper surface CF3a of the third color filter CF3 meets the convex surface of the optical patterns LP, and the lower surface of the optical patterns LP in contact with the upper surface CF3a of the third color filter CF3, as shown in FIG. 9.

Referring back to FIG. 5, as described above, the thickness $T_{BM}$ of the light-blocking member BM may be designed so that the surface height of the light-blocking member BM is greater than the surface height of the optical patterns LP to reduce or prevent physical damage to the optical patterns LP. In some embodiments, if a separate element (e.g., an optical member, etc.) is located on the light-blocking member BM and the optical patterns LP, the optical patterns LP may be physically damaged by the separate element. In view of the above, according to some embodiments of the present disclosure, to reduce or prevent physical damage to the optical patterns LP, the thickness $T_{BM}$ of the light-blocking member BM may be designed so that the surface height of the light-blocking member BM is greater than the surface height of the optical patterns LP, thereby reducing or preventing damage to the optical patterns LP due to the separate element.

It should be noted that if the thickness $T_{BM}$ of the light-blocking member BM is relatively or comparatively large to reduce or prevent physical damage to the optical patterns LP, the material cost associated with the light-blocking member BM might not be inconsiderable. Therefore, it may be suitable that the thickness $T_{BM}$ of the light-blocking member BM is less than the thickness $T_{PW1}$ of the first partition wall PW1, and greater than the thickness $T_{PW2}$ of the second partition wall PW2.

Figure 10:
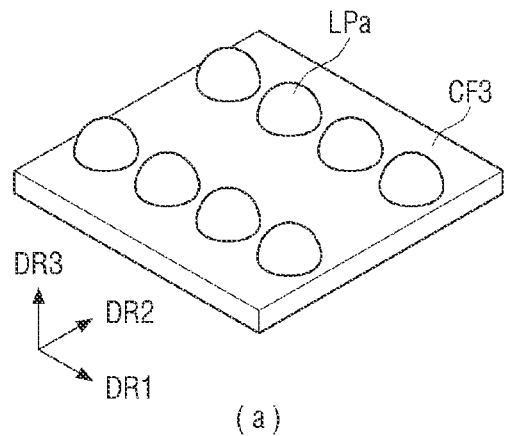
FIGS. 10(a) to 10(e) are perspective views showing a variety of modifications of the optical patterns.
Figure 10:
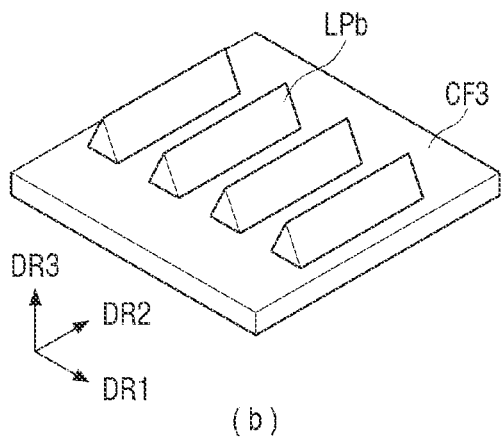
Figure 10:
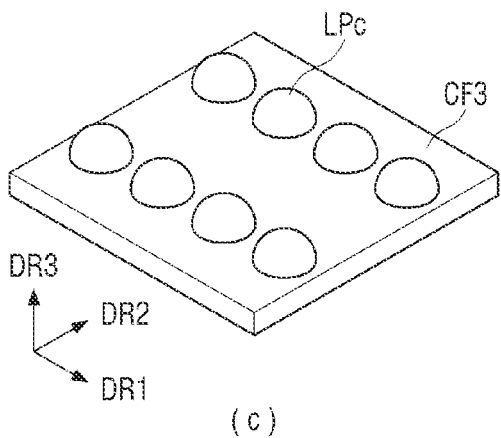
Figure 10:
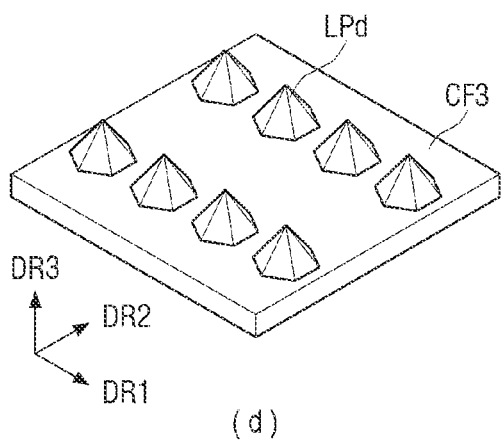
Figure 10:
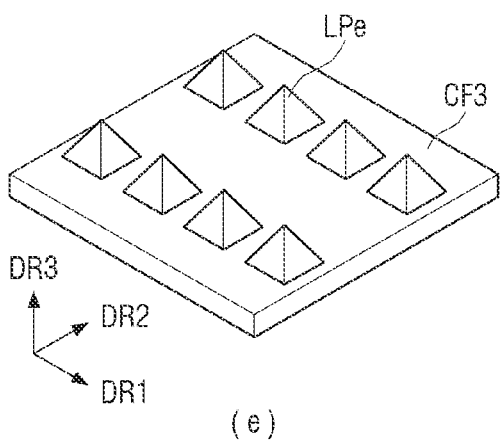

FIG. 10(a) is a perspective view of an optical pattern according to some embodiments. FIGS. 10(b), 10(c), 10(d), and 10(e) are perspective views showing a variety of modifications of the optical patterns. Referring to FIGS. 10(a), 10(b), 10(c), 10(d), and 10(e), the optical patterns LPa, LPb, LPc, LPd and LPe may have an upwardly protruding shape. The optical pattern LPa according to some embodiments of FIG. 10(a) has an upward convex lens, and the optical pattern LPb according to some embodiments FIG. 10(b) has a prism shape. The optical patterns LP may extend in the second direction DR2, and may be arranged in the first direction DR1. The optical pattern LPc according to some embodiments of FIG. 10(c) may have a spherical shape that is convex upward. The optical pattern LPd according to some embodiments of FIG. 10(d) may have a hexagonal pyramid shape that protrudes upward. The optical pattern LPe according to some embodiments of FIG. 10(e) may have a quadrangular pyramid shape that protrudes upward.

Figure 11:
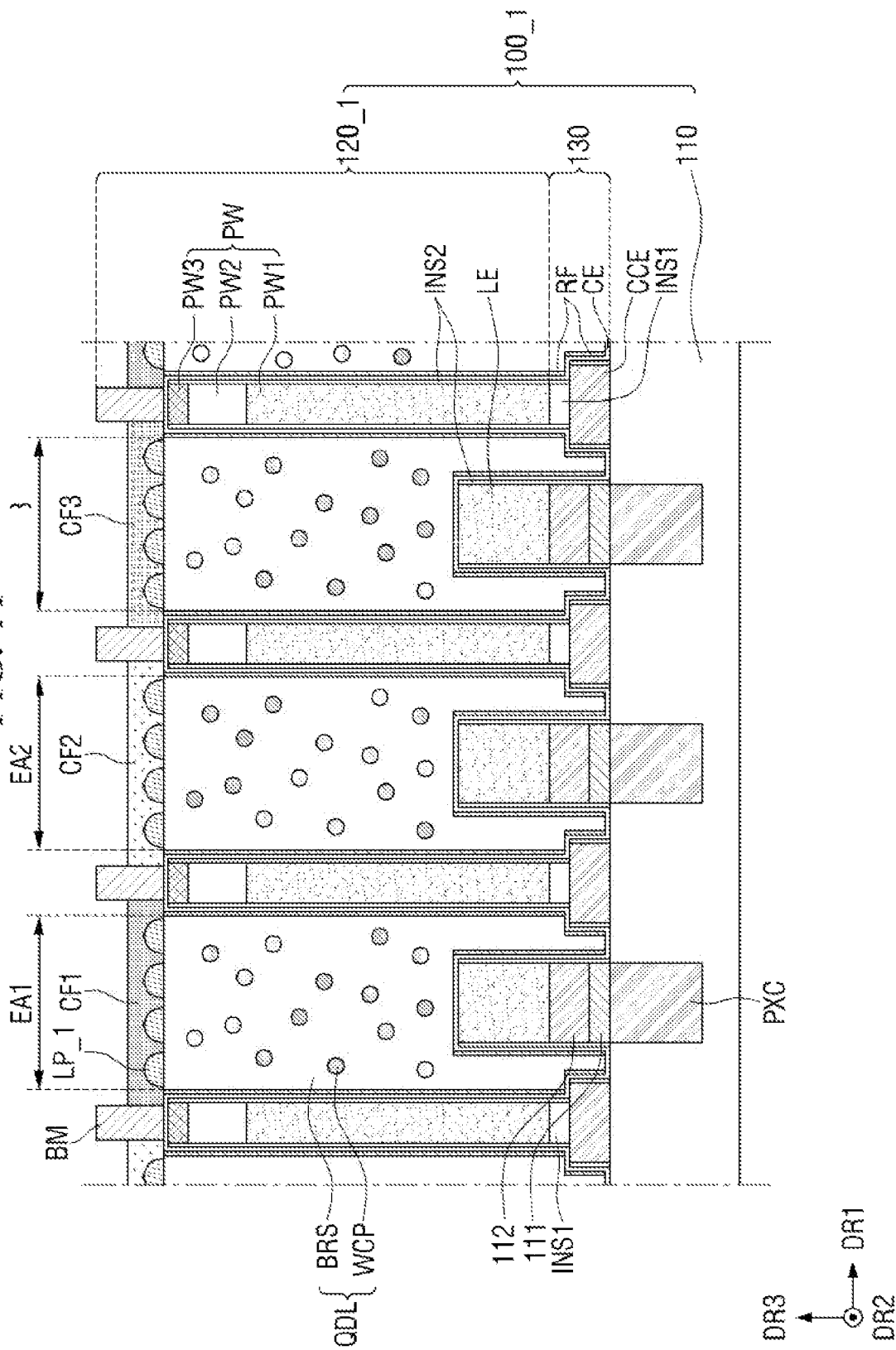
FIG. 11 is a cross-sectional view showing a display panel according to other embodiments of the present disclosure.

FIG. 11 is a cross-sectional view showing a display panel according to other embodiments of the present disclosure.

A display panel 100_1 according to some embodiments of FIG. 11 is different from the display panel 100 of the embodiments of FIG. 5 in that an optical pattern LP_1 of the display panel 100_1 is located between the wavelength conversion layer QDL and the color filters CF1, CF2, and CF3.

For example, the optical pattern LP_1 may be located directly on the base resin BRS of the wavelength conversion layer QDL. The color filters CF1, CF2, and CF3 may be located on the optical pattern LP_1. According to some embodiments, the refractive index of the optical pattern LP_1 may be greater than that of the base resin BRS of the wavelength conversion layer QDL, and may be greater than the refractive index of the color filters CF1, CF2, and CF3. Accordingly, it is possible to focus the light transmitted through wavelength conversion layer QDL.

The other elements may be similar or substantially identical to those described above with reference to FIG. 5. Therefore, redundant description will be omitted.

Figure 12:
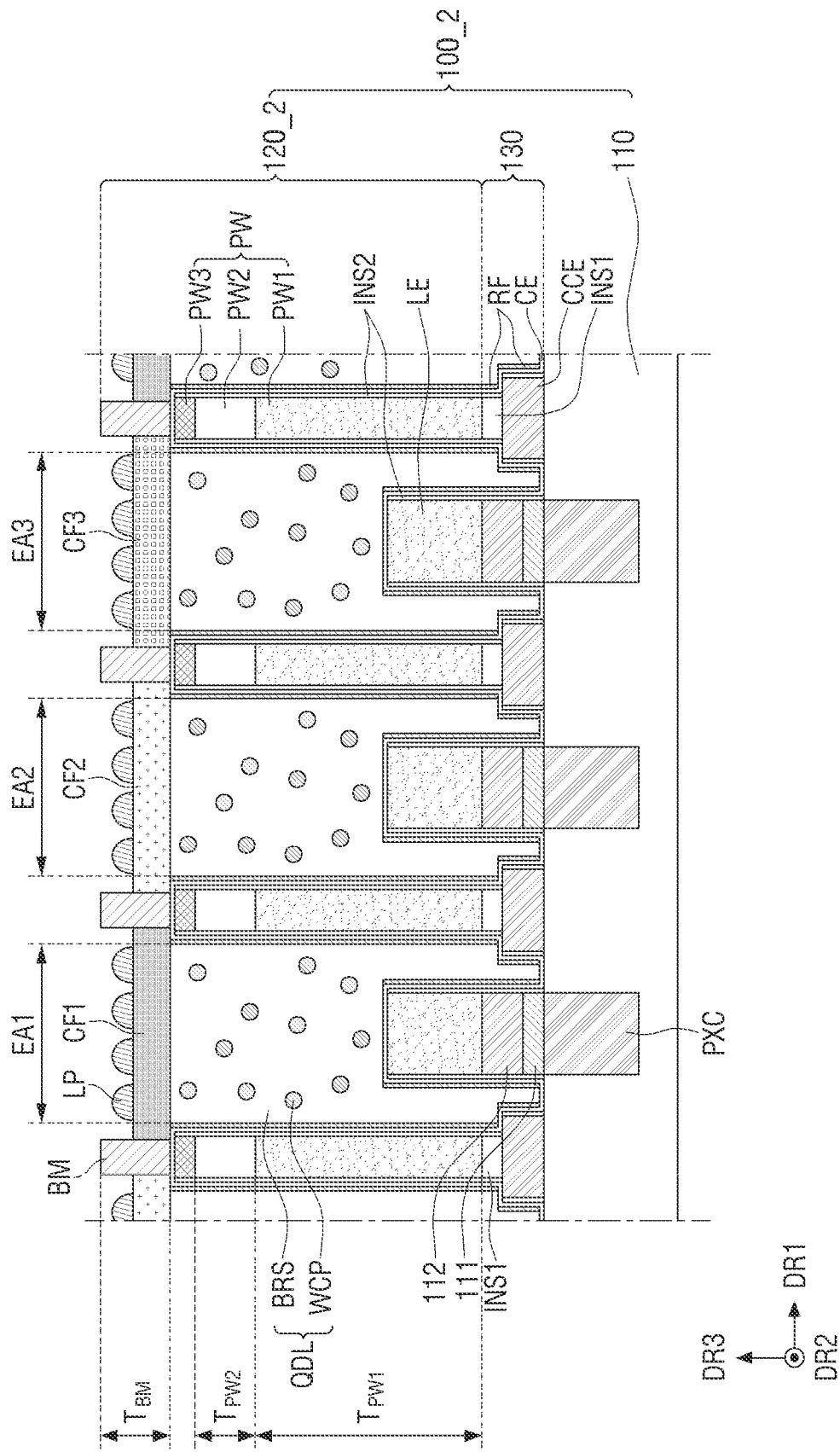
FIG. 12 is a cross-sectional view showing a display panel according to yet other embodiments of the present disclosure.

FIG. 12 is a cross-sectional view showing a display panel according to yet other embodiments of the present disclosure.

A display panel 100_2 according to some embodiments of FIG. 12 is different from the display panel 100_2 of the embodiments of FIG. 5 in that the thickness of the wavelength conversion layer QDL and the thickness of the partition wall PW of a light-emitting element layer 120_2 of the display panel 100_2 are generally reduced. According to some embodiments, the thicknesses of the partition wall PW and the wavelength conversion layer QDL are reduced, and thus the associated process time may be reduced.

Even in these embodiments, it may be suitable that the thickness $T_{BM}$ of the light-blocking member BM is less than the thickness $T_{PW1}$ of the first partition wall PW1, and greater than the thickness $T_{PW2}$ of the second partition wall PW2.

The other elements may be similar or substantially identical to those described above with reference to FIG. 5. Therefore, the redundant description will be omitted.

Figure 13:
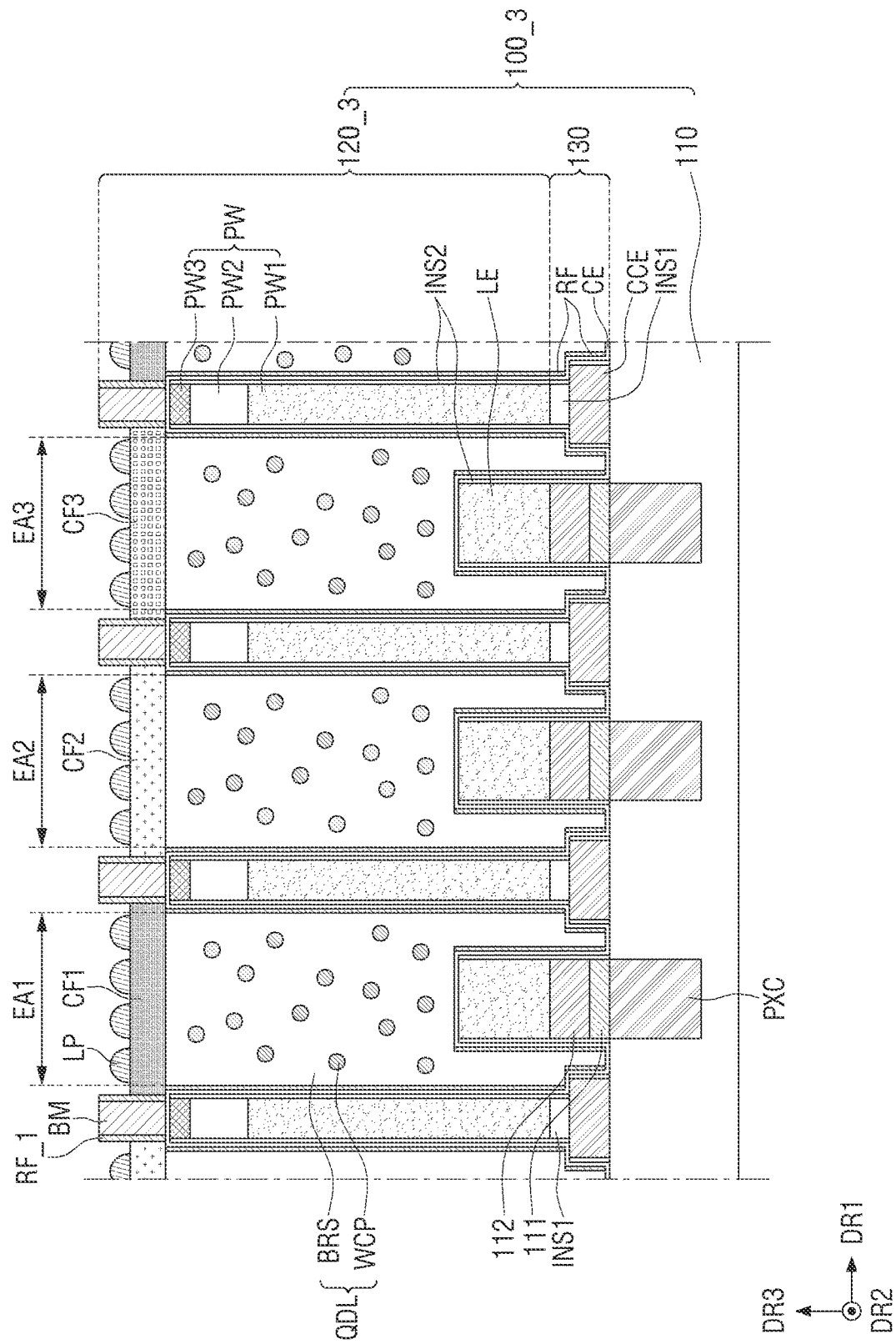
FIG. 13 is a cross-sectional view showing a display panel according to yet other embodiments of the present disclosure.

FIG. 13 is a cross-sectional view showing a display panel according to yet other embodiments of the present disclosure.

A display panel 100_3 according to some embodiments of FIG. 13 is different from the display panel 100 of the embodiments of FIG. 5 in that a reflective film RF_1 may be located on side surfaces of each of the light-blocking members BM of a light-emitting element layer 120_3 of the display panel 100_3.

For example, the material of the reflective film RF_1 may be the same as the material of the reflective film RF on the side surfaces of the partition wall PW of FIG. 5, but the present disclosure is not limited thereto. The reflective film RF_1 and the reflective film RF may be concurrently or substantially simultaneously formed, but the present disclosure is not limited thereto. The reflective film RF_1 may be located between the side surfaces of the light-blocking member BM and the color filters CF1, CF2, and CF3. The reflective film RF_1 may be located between the side surfaces of the light-blocking member BM and the optical patterns LP. The reflective film RF_1 may be in direct contact with the side surfaces of the light-blocking member BM and the color filters CF1, CF2, and CF3. According to some embodiments, the reflective film RF_1 is further located on the side surfaces of the light-blocking member BM as well as the side surfaces of the partition wall PW, so that some of the lights transmitted through wavelength conversion layer QDL, which travel in other directions than the vertical direction, are reflected.

Figure 14:
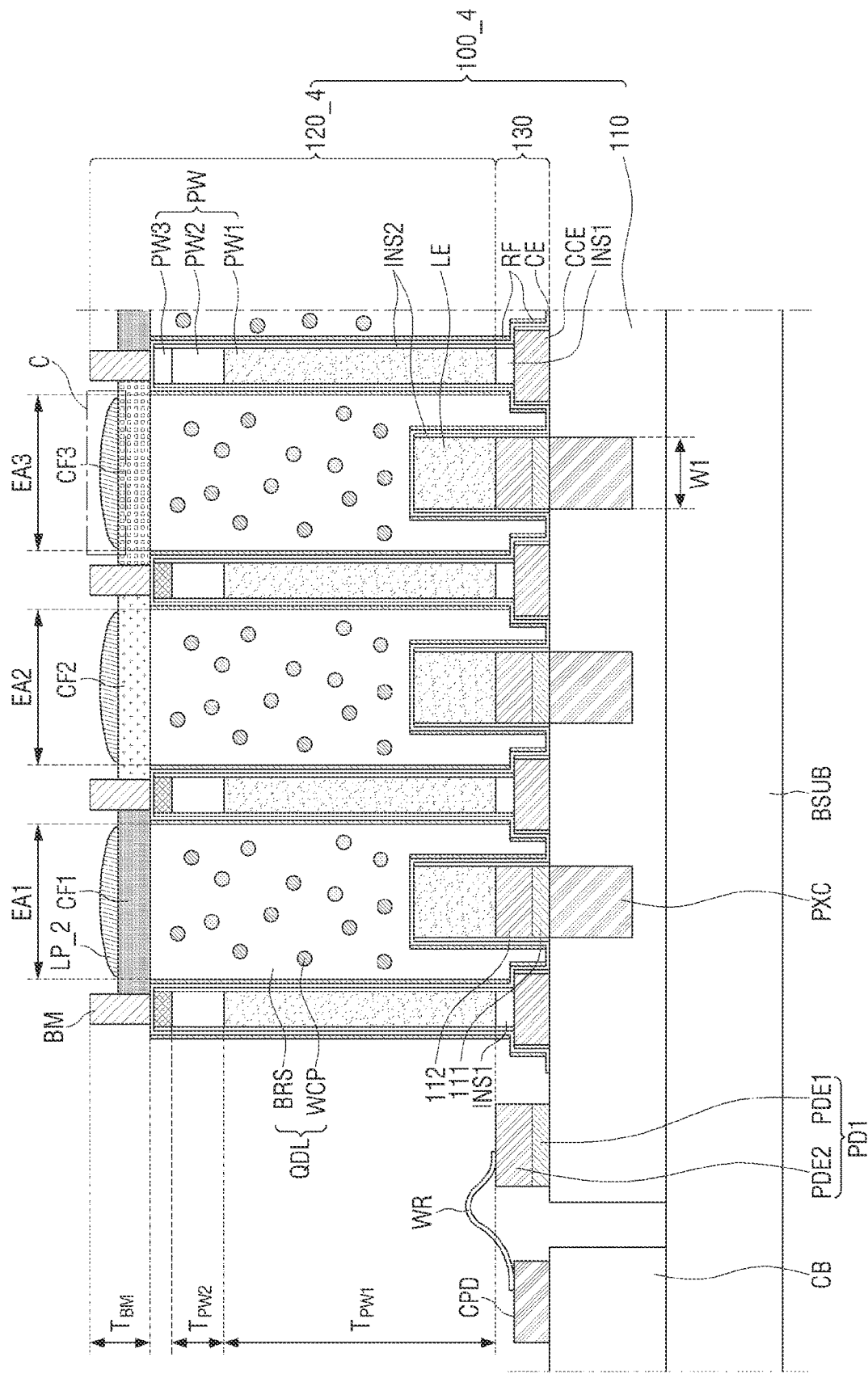
FIG. 14 is a cross-sectional view showing a display panel according to yet other embodiments of the present disclosure.

FIG. 14 is a cross-sectional view showing a display panel according to yet other embodiments of the present disclosure.

A display panel 100_4 according to some embodiments of FIG. 14 is different from the display panel 100 of the embodiments of FIG. 5 in that an optical pattern LP_2 of a light-emitting element layer 120_4 of the display panel 100_4 is implemented as a single piece in each of the emission area EA1, EA2, and EA3.

The cross-sectional shape of the optical pattern LP_2 of FIG. 14 may be similar or substantially identical to the cross-sectional shape of the optical pattern LP described above with reference to FIG. 5, except for the size. According to some embodiments, because one optical pattern LP_2 is located in each of the emission areas EA1, EA2, and EA3, the contact area between the optical pattern LP_2 and each of the color filters CF1, CF2, and CF3 may be increased. As described above with reference to FIG. 9, the optical patterns LP may focus the lights traveling in directions that are oblique to the vertical direction among the lights transmitted through third color filters CF1, CF2, and CF3 at the interface between the optical patterns LP and the color filters CF1, CF2, and CF3, so that the lights travel in directions that are less oblique to the vertical direction (lights are focused to the center of the emission area EMA3). According to some embodiments, one optical pattern LP of the light-emitting element layer 120_4 is located in each of the emission areas EA1, EA2, and EA3, and thus the interface between the optical pattern LP and the color filters CF1, CF2, and CF3 may be expanded. Accordingly, light may be focused more effectively.

Figure 15:
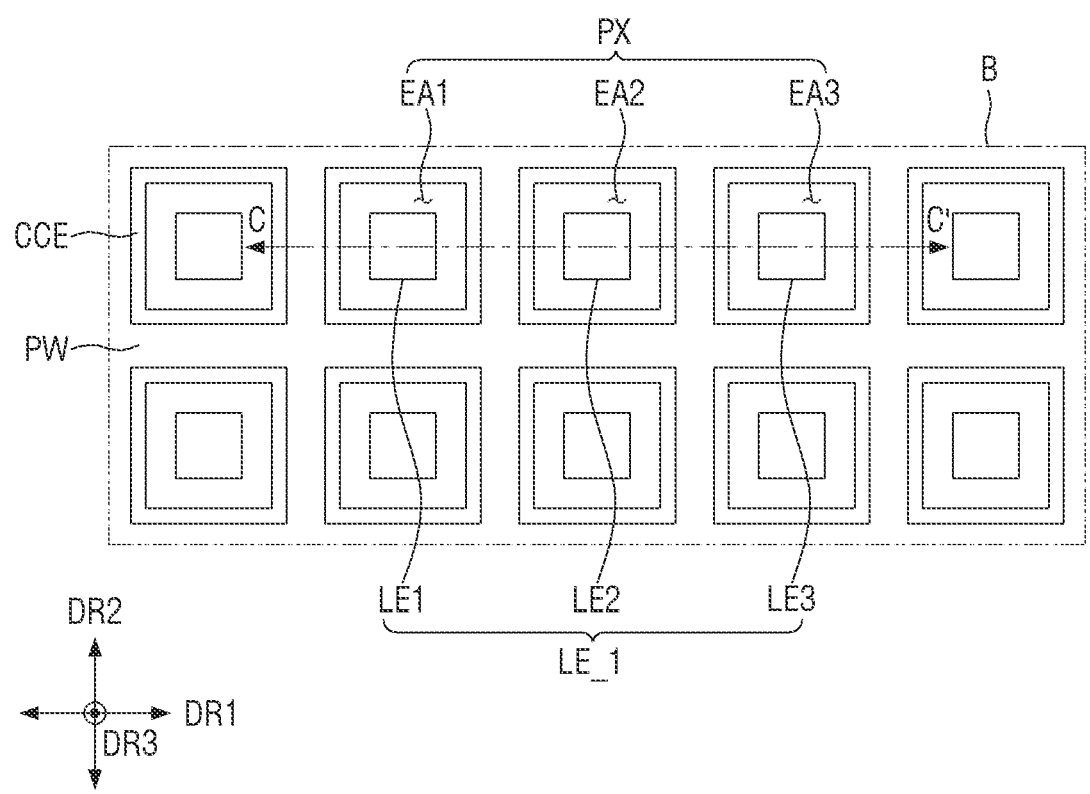
FIG. 15 is a view showing a layout of pixels of a display panel according to some embodiments of the present disclosure.
Figure 16:
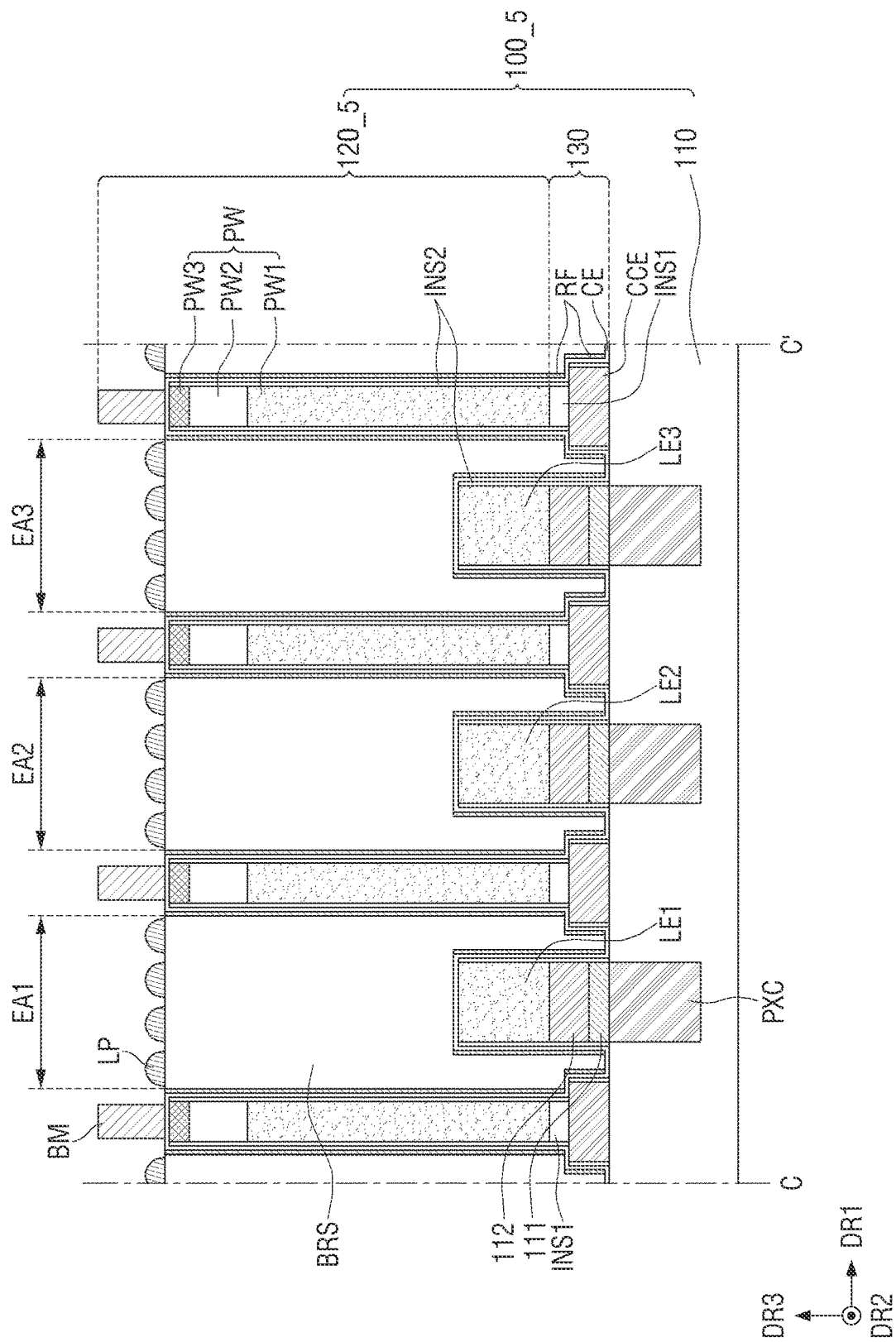
FIG. 16 is a cross-sectional view showing a display panel taken along the line C-C' of FIG. 15.

FIG. 15 is a view showing a layout of pixels of a display panel according to some embodiments of the present disclosure. FIG. 16 is a cross-sectional view showing a display panel taken along the line C-C' of FIG. 15.

A display device according to some embodiments of FIGS. 15 and 16 is different from the display device according to the embodiments of FIGS. 3 and 5 in that a light-emitting element LE_1 includes a first light-emitting element LE1 for emitting a first light, a second light-emitting element LE2 for emitting a second light, and a third light-emitting element LE3 for emitting a third light.

For example, in a light-emitting element layer 120_5 of a display panel 100_5 according to some embodiments, light-emitting elements LE1, LE2, and LE3 for respectively emitting the first to third lights are respectively located in emission areas EA1, EA2, and EA3, and thus the wavelength conversion particles WCP of the wavelength conversion layer QDL according to some embodiments FIG. 5 may be eliminated. As the wavelength conversion particles WCP of the wavelength conversion layer QDL are eliminated, only the base resin BRS of the wavelength conversion layer QDL remains in the space (or area) in which the wavelength conversion layer QDL of FIG. 5 is located. Hereinafter, the base resin BRS may also be referred to as a filling layer.

As shown in FIG. 16, the optical pattern LP may be located directly on the base resin BRS. According to some embodiments, the refractive index of the optical pattern LP may be greater than that of the base resin BRS. Accordingly, it is possible to focus the light transmitted through base resin BRS.

Figure 17:
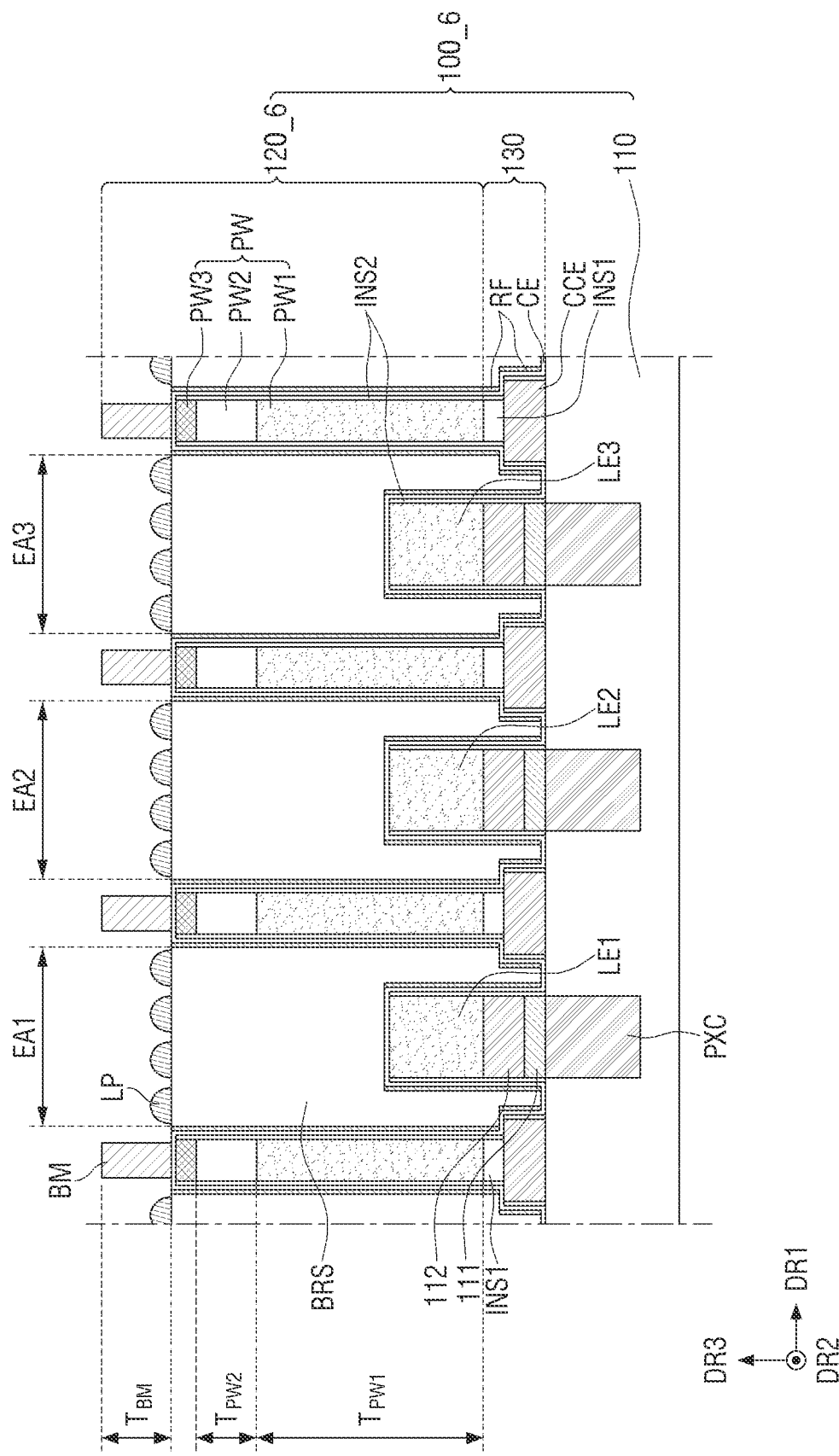
FIG. 17 is a cross-sectional view showing a display panel according to yet other embodiments of the present disclosure.

FIG. 17 is a cross-sectional view showing a display panel according to yet other embodiments of the present disclosure.

A display panel 100_6 according to some embodiments of FIG. 17 is different from the display panel 100_5 of the embodiments of FIG. 16 in that the thickness of the base resin BRS and the thickness of the partition wall PW of a light-emitting element layer 120_6 are generally reduced, like the embodiments of FIG. 12. According to some embodiments, the thicknesses of the partition wall PW and the wavelength conversion layer QDL are reduced, and thus the process time may be reduced.

Even in these embodiments, it may be suitable that the thickness $T_{BM}$ of the light-blocking member BM is less than the thickness $T_{PW1}$ of the first partition wall PW1, and greater than the thickness $T_{PW2}$ of the second partition wall PW2.

Figure 18:
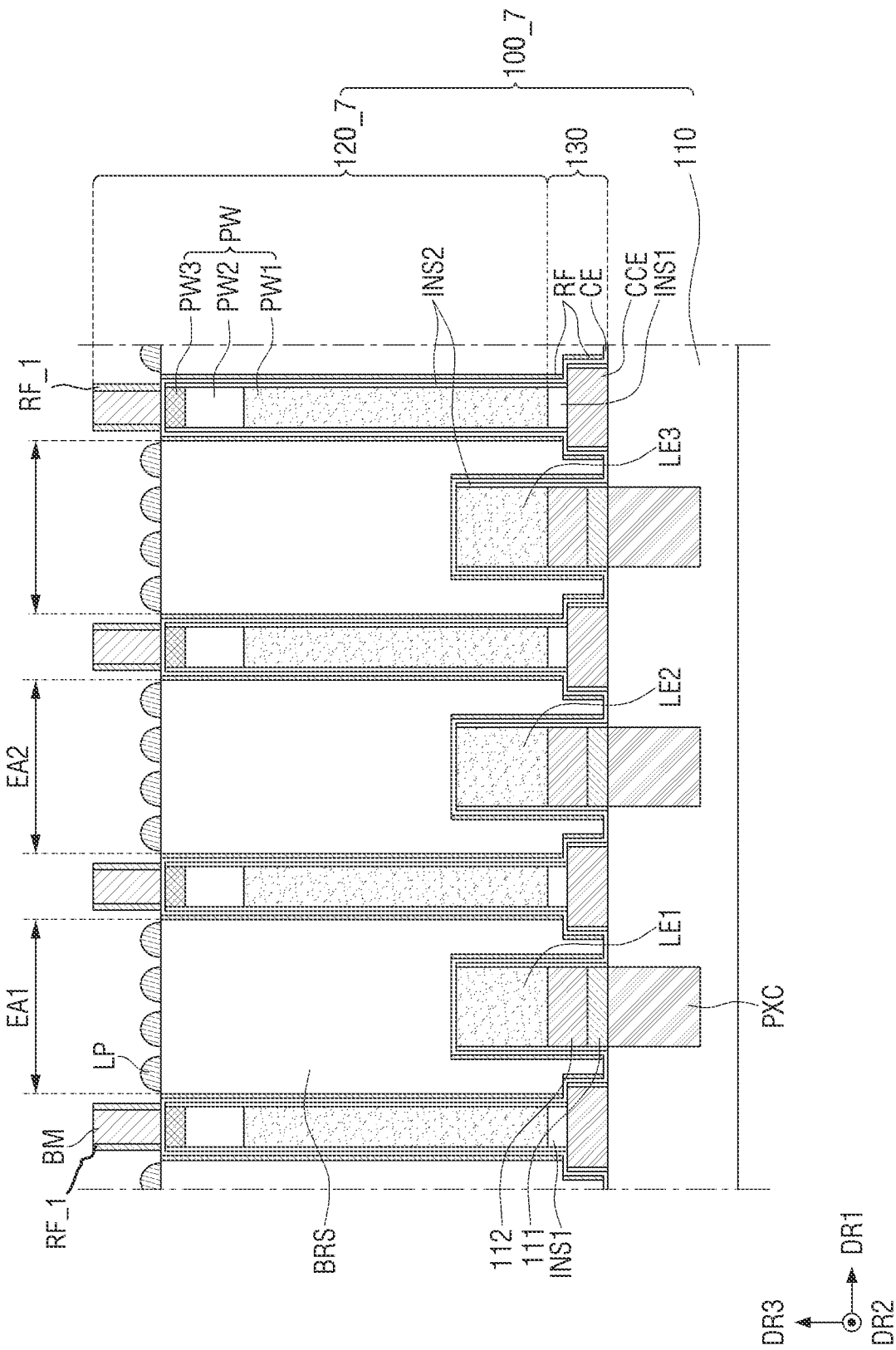
FIG. 18 is a cross-sectional view showing a display panel according to yet other embodiments of the present disclosure.

FIG. 18 is a cross-sectional view showing a display panel according to yet other embodiments of the present disclosure.

A display panel 100_7 according to some embodiments of FIG. 18 is different from the display panel 100_5 of embodiments of FIG. 16 in that a reflective film RF_1 may be located on side surfaces of each of the light-blocking members BM of a light-emitting element layer 120_7 of the display panel 100_7.

For example, the material of the reflective film RF_1 may be the same as the material of the reflective film RF on the side surfaces of the partition wall PW of FIG. 16, but the present disclosure is not limited thereto. The reflective film RF_1 and the reflective film RF may be simultaneously formed, but the present disclosure is not limited thereto. The reflective film RF_1 may be located between the side surfaces of the light-blocking member BM and the optical patterns LP. The reflective film RF_1 may be in direct contact with the side surfaces of the light-blocking member BM. According to some embodiments, the reflective film RF_1 is further located on the side surfaces of the light-blocking member BM as well as the side surfaces of the partition wall PW, so that some of the lights transmitted through base resin BRS, which travel in other directions than the vertical direction, are reflected.

Figure 19:
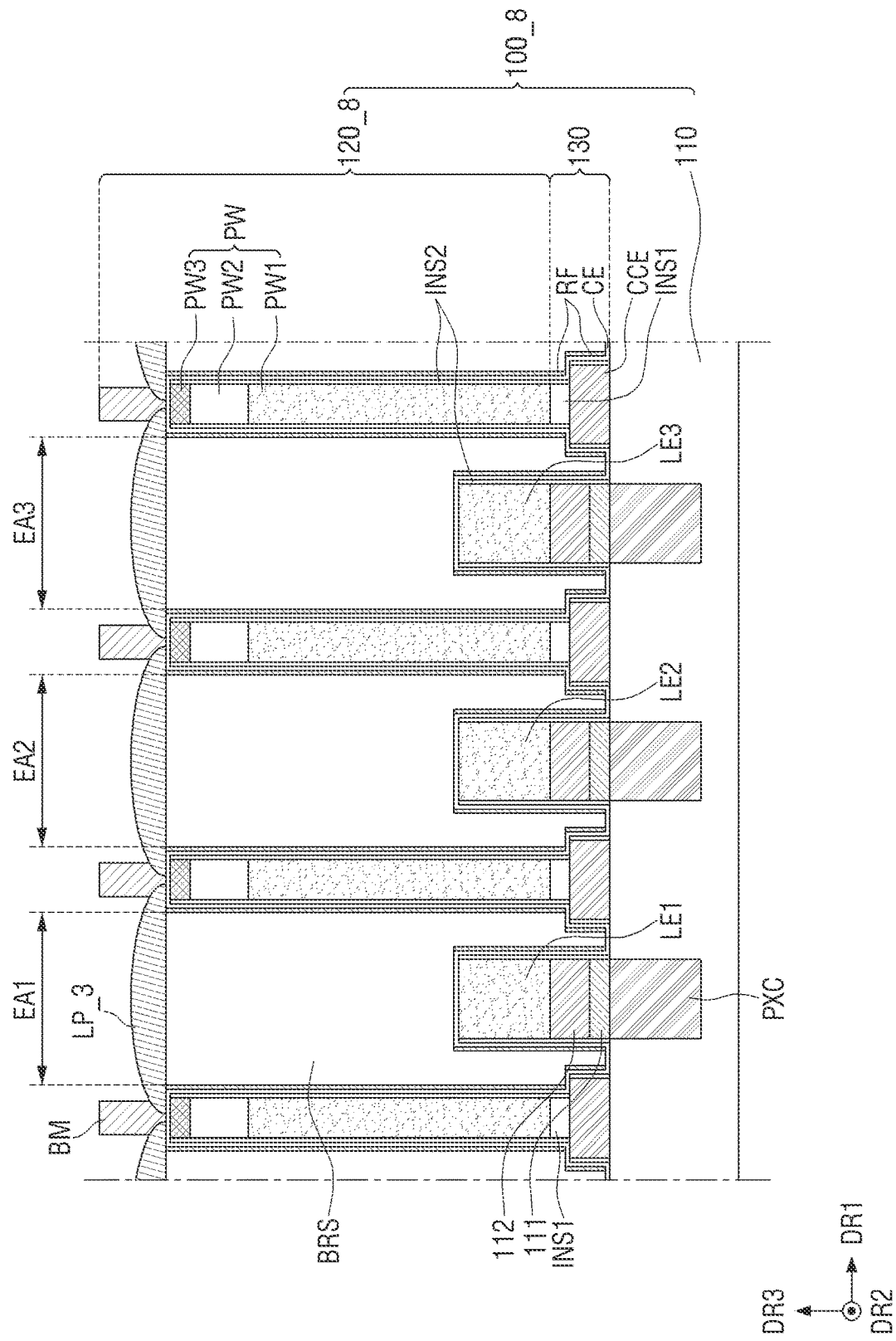
FIG. 19 is a cross-sectional view showing a display panel according to yet other embodiments of the present disclosure.

FIG. 19 is a cross-sectional view showing a display panel according to yet other embodiments of the present disclosure.

A display panel 100_8 according to some embodiments of FIG. 19 is different from the display panel 100_5 of the embodiments of FIG. 16 in that an optical pattern LP_3 of a light-emitting element layer 120_8 of the display panel 100_8 is implemented as a single piece in each of the emission areas EA1, EA2, and EA3.

The cross-sectional shape of the optical pattern LP_3 of FIG. 19 may be similar or substantially identical to the cross-sectional shape of the optical pattern LP described above with reference to FIG. 5 except for the size. According to some embodiments, because one optical pattern LP_3 is located in each of the emission areas EA1, EA2, and EA3, the contact area between the optical pattern LP_3 and the corresponding base resin BRS may be increased. Accordingly, light may be focused more effectively.

According to some embodiments, the width of the optical pattern LP_3 may be greater than the distance between the partition wall PW and another adjacent partition wall. That is, the optical pattern LP_3 may overlap not only the base resin BRS, but may also overlap the partition wall PW. The optical pattern LP_3 may be in direct contact with the common electrode CE on the partition wall PW. The light-blocking member BM may be located on the optical pattern LP_3. That is to say, the light-blocking member BM may be in direct contact with the surface of the optical pattern LP_3 that protrudes upward.

Figure 20:
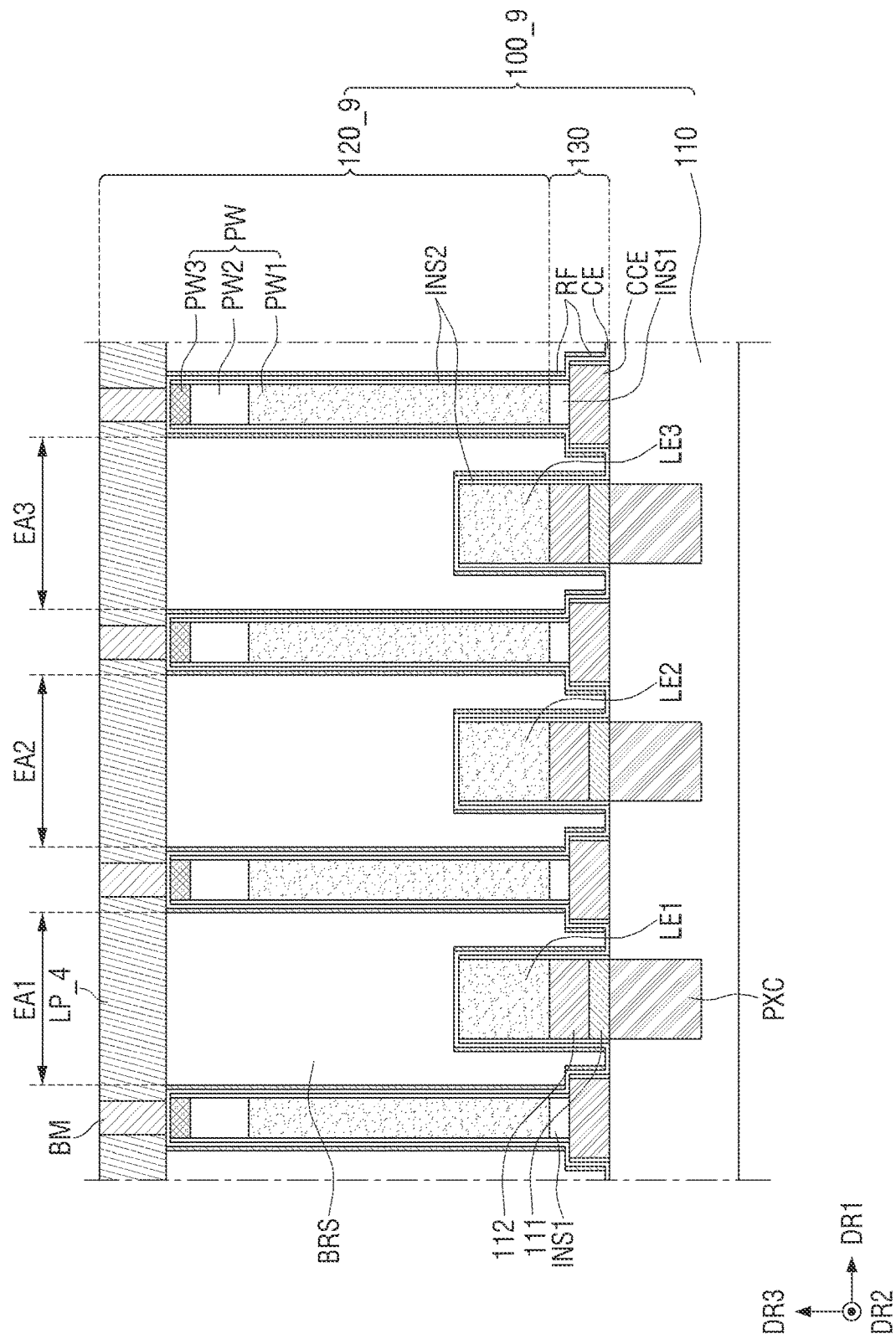
FIG. 20 is a cross-sectional view showing a display panel according to yet other embodiments of the present disclosure.

FIG. 20 is a cross-sectional view showing a display panel according to yet other embodiments of the present disclosure.

A display panel 100_9 according to some embodiments of FIG. 20 is different from the display panel 100_5 according to the embodiments of FIG. 16 in that a space between adjacent light-blocking members BM may be filled with an optical pattern LP_4 of a light-emitting element layer 120_9.

The surface height of the optical pattern LP_4 may be equal to the surface height of the adjacent light-blocking member BM, but the present disclosure is not limited thereto.

The refractive index of the optical pattern LP_4 may be different from that of the underlying base resin BRS adjacent thereto. Accordingly, the path of light emitted from the light-emitting element LE may be changed at the interface between the base resin BRS and the optical pattern LP_4 through the optical pattern LP_4.

The other elements are similar or substantially identical to those described above with reference to FIG. 16. Therefore, the redundant description will be omitted.

Figure 21:
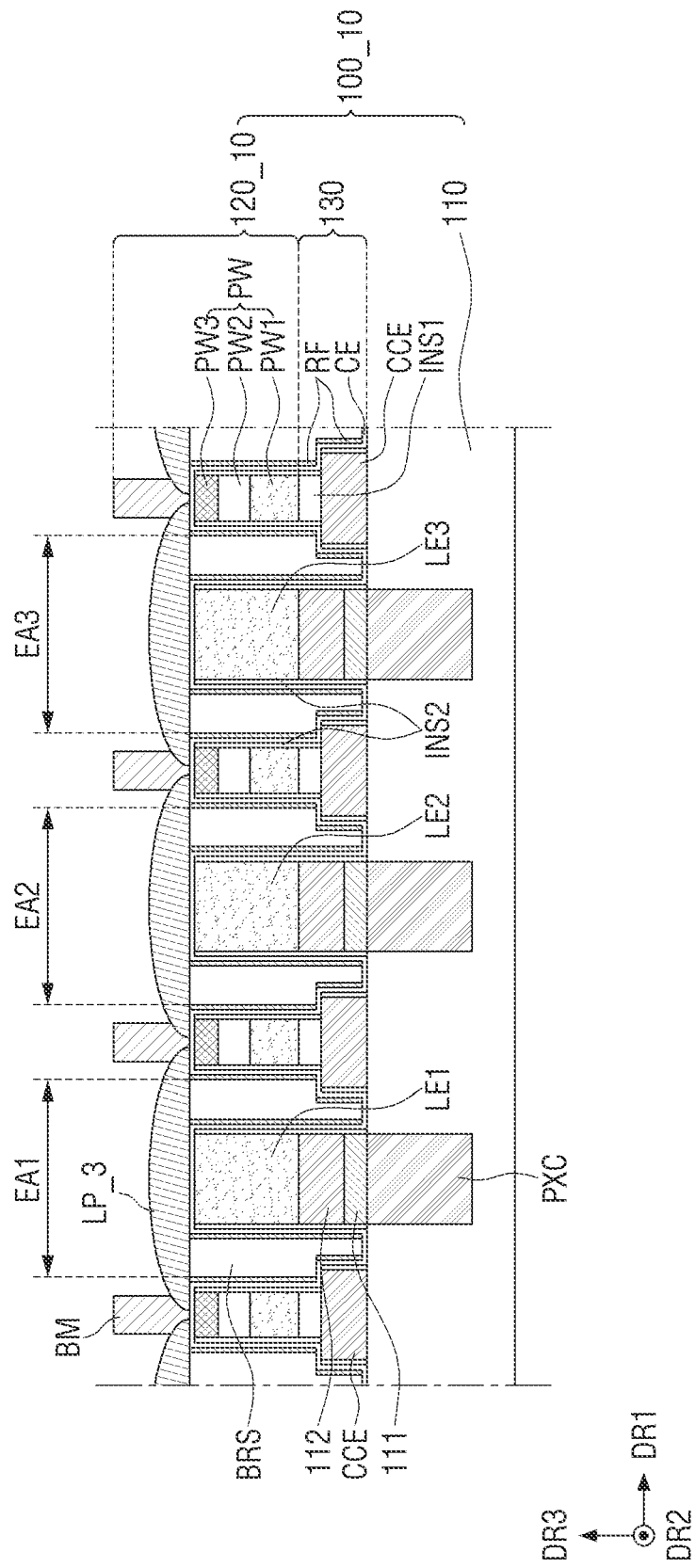
FIG. 21 is a cross-sectional view showing a display panel according to yet other embodiments of the present disclosure.

FIG. 21 is a cross-sectional view showing a display panel according to yet other embodiments of the present disclosure.

A display panel 100_10 according to some embodiments of FIG. 21 is different from the display panel 100_8 of the embodiments of FIG. 19 in that the thickness of the base resin BRS and the thickness of the partition wall PW of a light-emitting element layer 120_10 are generally reduced, like the embodiments of FIG. 17. According to some embodiments, the thicknesses of the partition wall PW and the wavelength conversion layer QDL are reduced, and thus the associated process time may be reduced.

The other elements are similar or substantially identical to those described above with reference to FIG. 19. Therefore, the redundant description will be omitted.

Figure 22:
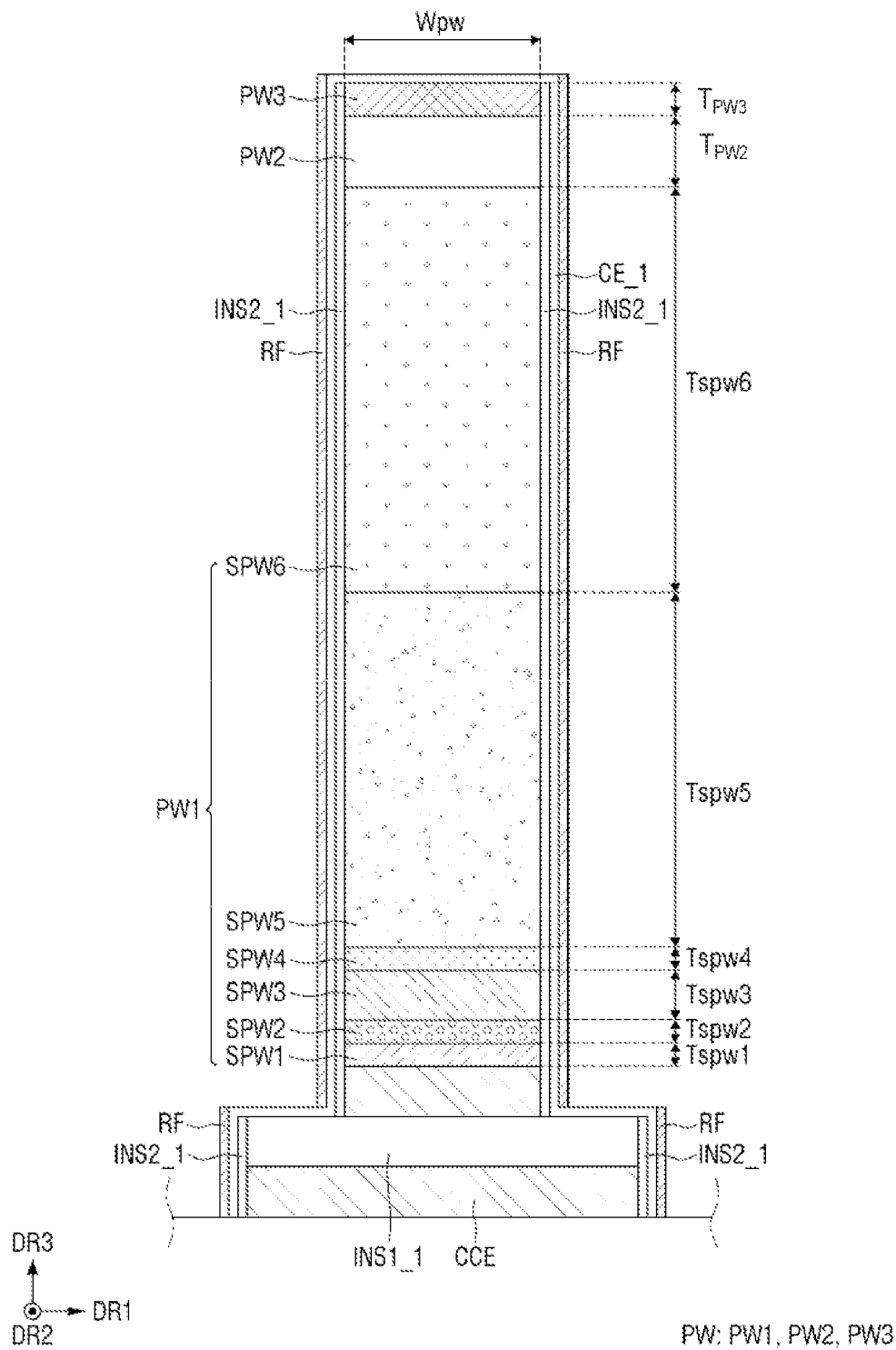
FIG. 22 is an enlarged, cross-sectional view showing another example of the partition wall of FIG. 5.

FIG. 22 is an enlarged, cross-sectional view showing another example of the partition wall of FIG. 5.

The embodiments of FIG. 22 are different from the embodiments of FIG. 7 in that a first insulating film INS1_1 completely covers the upper surface of a common connection electrode CCE. The elements of FIG. 22 that are similar or substantially identical to those of FIG. 7 will not be described to avoid redundancy.

Referring to FIG. 22, the first insulating film INS1_1 may be located on the upper surface of the common connection electrode CCE. Because the first insulating film INS1_1 completely covers the upper surface of the common connection electrode CCE, the surface of the common connection electrode CCE may not be exposed. Accordingly, a common electrode CE_1 may be in contact with the upper surface of the first insulating film INS1_1, and may not be in contact with the upper surface of the common connection electrode CCE. In this instance, the common electrode CE_1 may be connected to a common voltage supply in the non-display area NDA to receive the common voltage.

The second insulating film INS2_1 may be located on side surfaces of the first insulating film INS1_1, and a reflective film RF may be located on the common electrode CE_1 located on the side surfaces of the first insulating film INS1_1.

Figure 23:
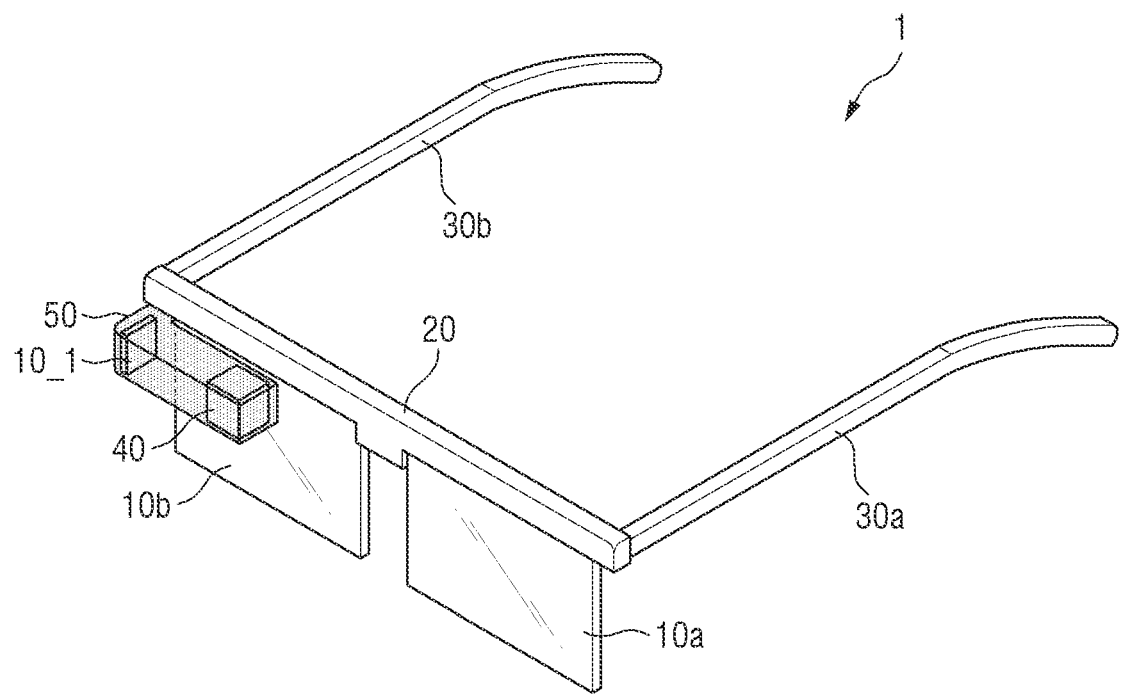
FIG. 23 is a view showing an example of a virtual reality device including a display device according to some embodiments.

FIG. 23 is a view showing an example of a virtual reality device including a display device according to some embodiments. FIG. 23 shows a virtual reality device 1 employing a display device 10_1 according to some embodiments.

Referring to FIG. 23, the virtual reality device 1 according to some embodiments may be a device in the form of glasses. The virtual reality device 1 according to some embodiments of the present disclosure may include the display device 10_1, a left eye lens 10a, a right eye lens 10b, a support frame 20, eyeglass temples, or bows, 30a and 30b, a reflective member 40, and a display case 50.

Although FIG. 23 shows the virtual reality device 1 including the eyeglass temples 30a and 30b, in other embodiments of the present disclosure, a head mounted display with a head strap, instead of the eyeglass temples 30a and 30b, may be employed as the virtual reality device 1. That is to say, the virtual reality device 1 is not limited to that shown in FIG. 23, but may be applied in a variety of electronic devices in a variety of forms.

The display case 50 may include the display device 10_1 and the reflective member 40. An image displayed on the display device 101 may be reflected by the reflective member 40, and may be provided to the user's right eye through the right eye lens 10b. Accordingly, the user may watch a virtual reality image displayed on the display device 10_1 through the right eye.

Although the display case 50 is located at the right end of the support frame 20 in the example shown in FIG. 23, the embodiments of the present disclosure are not limited thereto. For example, the display case 50 may be located at the left end of the support frame 20. In such case, an image displayed on the display device 10_1 is reflected by the reflective member 40, and may be provided to the user's left eye through the left eye lens 10a. Accordingly, the user may watch a virtual reality image displayed on the display device 10_1 through the left eye. Alternatively, the display cases 50 may be located at both the left and right ends of the support frame 20, respectively. In such a case, the user may watch a virtual reality image displayed on the display device 10_1 through both the left and right eyes.

Figure 24:
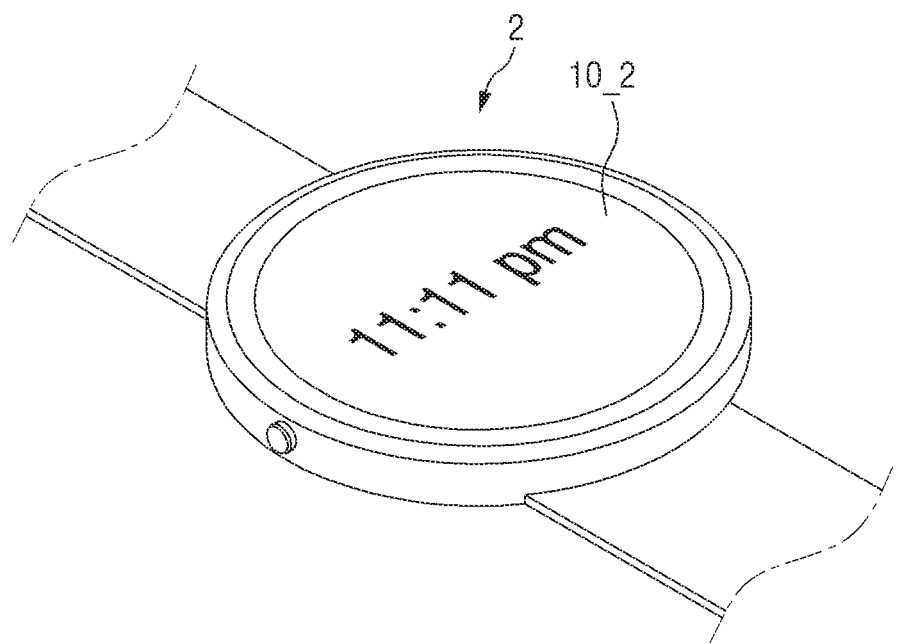
FIG. 24 is a view showing an example of a smart device including a display device according to some embodiments of the present disclosure.

FIG. 24 is a view showing an example of a smart device including a display device according to some embodiments of the present disclosure.

Referring to FIG. 24, a display device 10_2 according to some embodiments may be applied to a smart watch 2 that is one of smart devices.

Figure 25:
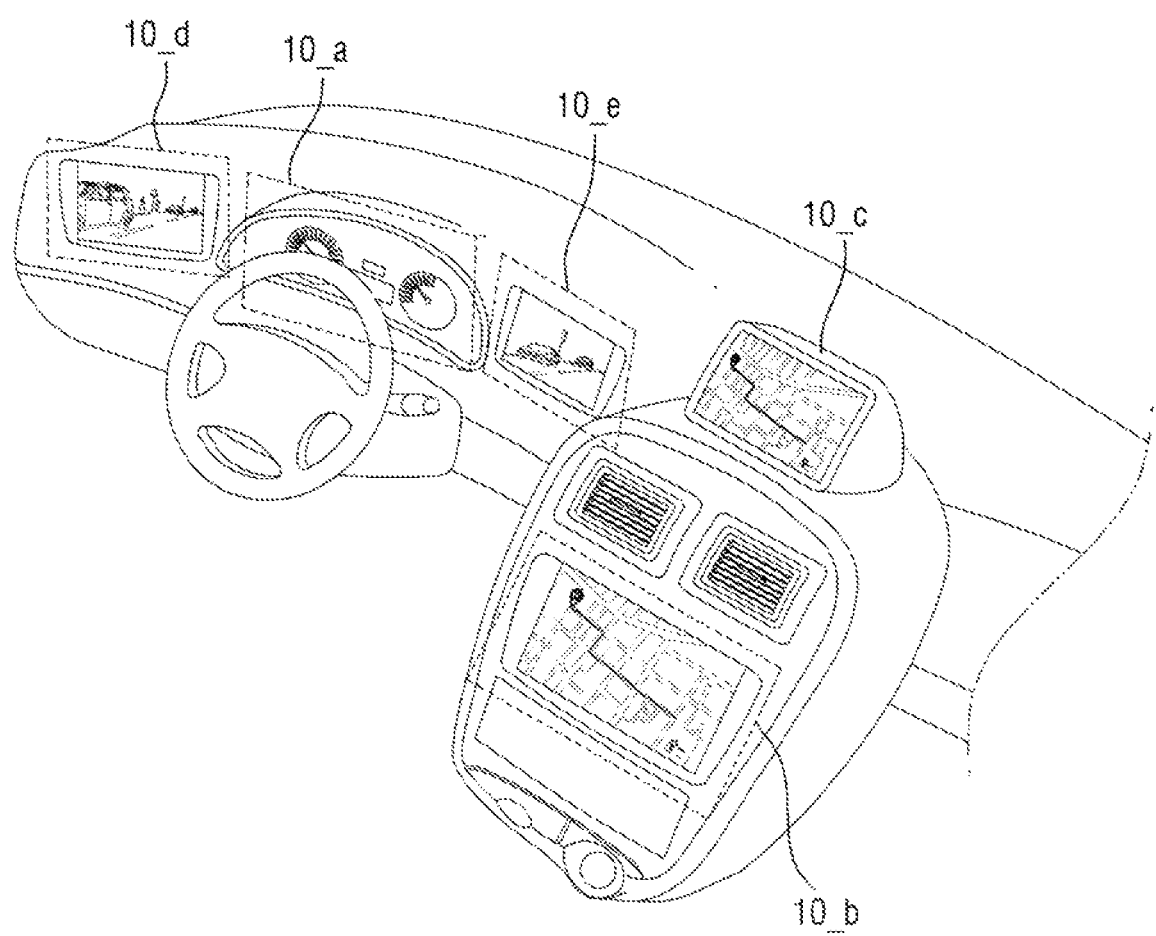
FIG. 25 is a view showing an example of an instrument cluster and a center fascia including display devices according to some embodiments.

FIG. 25 is a view showing an example of an instrument cluster and a center fascia including display devices according to some embodiments. FIG. 25 shows a vehicle in which display devices 10_a, 10_b, 10_c, 10_d, and 10_e according to some embodiments are applied.

Referring to FIG. 25, the display devices 10_a, 10_b, and 10_c according to some embodiments of the present disclosure may be applied to the instrument cluster of a vehicle, may be applied to the center fascia of the vehicle, or may be applied to a center information display (CID) located on the dashboard of the vehicle. The display devices 10_d and 10_e according to some embodiments of the present disclosure may be applied to room mirror displays, which may replace side mirrors of the vehicle.

Figure 26:
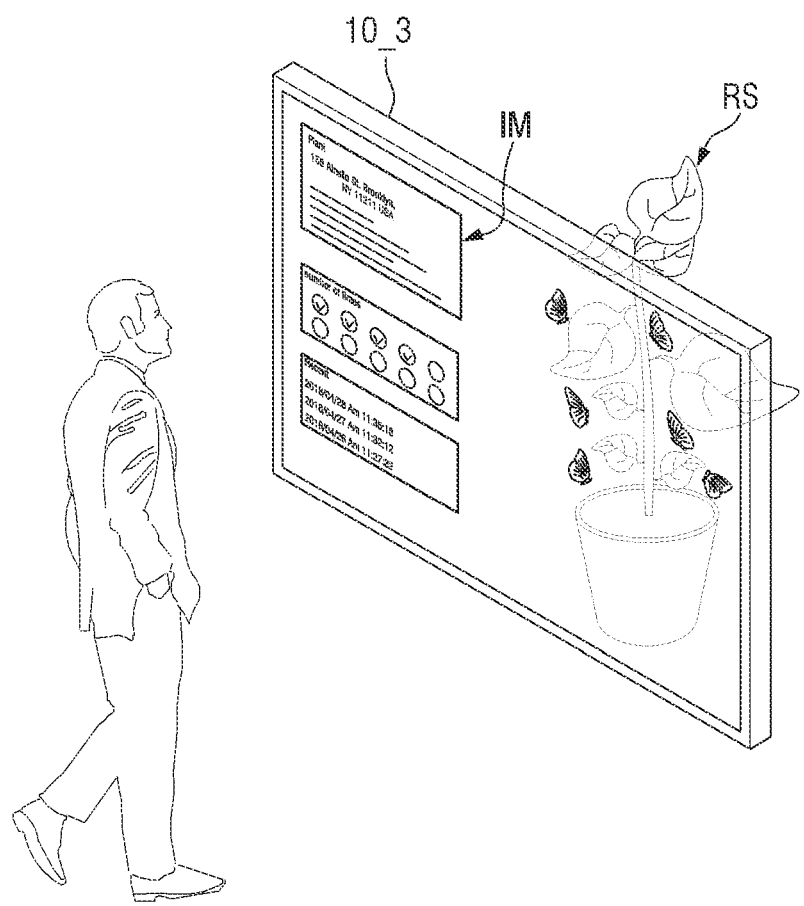
FIG. 26 is a view showing an example of a transparent display device including a transparent display device according to some embodiments.

FIG. 26 is a view showing an example of a transparent display device including a display device according to some embodiments.

Referring to FIG. 26, a display device 10_3 according to some embodiments may be applied to a transparent display device. The transparent display device may transmit light while displaying images IM. Therefore, a user located on, or in front of, the front side of the transparent display device may view not only the images IM displayed on the display device 10_3, but may also view an object RS or the background located on, or behind, the rear side of the transparent display device. When the display device 10_3 is applied to the transparent display device, the first substrate SUB1 of the display device 10_3 shown in FIGS. 4 and 5 may include a light-transmitting portion that may transmit light or may be made of a material that may transmit light.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims, with functional equivalents thereof to be included therein.

What is claimed is:

1. A display device comprising:
a substrate;
a partition wall on the substrate;
a light-emitting element in an emission area partitioned by the partition wall on the substrate, and extending in a thickness direction of the substrate;
a wavelength conversion layer over the light-emitting element in the emission area, and comprising a base resin, and a scatterer dispersed in the base resin and that converts a wavelength of light emitted from the light-emitting element;
a light-blocking member on the partition wall; and
at least one optical pattern on the wavelength conversion layer in the emission area, and having an upwardly protruding shape,
wherein the partition wall comprises a first partition wall comprising a same material as the light-emitting element,
wherein the light-emitting element comprises a first semiconductor layer, an active layer on the first semiconductor layer, and a second semiconductor layer on the active layer, and
wherein the first partition wall comprises a first subsidiary partition wall comprising a same material as the first semiconductor layer, a second subsidiary partition wall comprising a same material as the active layer, and a third subsidiary partition wall comprising a same material as the second semiconductor layer.

2. The display device of claim 1, wherein a surface height of the light-blocking member is greater than a surface height of the optical pattern.

3. The display device of claim 1, wherein a cross-sectional shape of the optical pattern comprises a lens shape that is convex upward, and
wherein an initial angle of the lens shape is about 30 degrees or more.

4. The display device of claim 1, wherein the optical pattern is in direct contact with the light-blocking member.

5. The display device of claim 4, wherein a width of the optical pattern is greater than a distance between the partition wall and an adjacent partition wall.

6. The display device of claim 1, wherein a thickness of the third subsidiary partition wall is equal to or greater than a thickness of the second semiconductor layer.

7. The display device of claim 1, wherein the first partition wall further comprises a fourth subsidiary partition wall on the third subsidiary partition wall, and comprising an undoped semiconductor material.

8. The display device of claim 7, wherein a thickness of the fourth subsidiary partition wall is greater than a thickness of the second semiconductor layer.

9. The display device of claim 1, wherein a thickness of the light-blocking member is less than a thickness of the first subsidiary partition wall, and greater than a thickness of the second subsidiary partition wall.

10. The display device of claim 1, further comprising a reflective film on side surfaces of the partition wall and on side surfaces of the light-emitting element.

11. The display device of claim 10, wherein the reflective film is on side surfaces of the light-blocking member.

12. A display device comprising:
a substrate;
a partition wall on the substrate;
a light-emitting element in an emission area partitioned by the partition wall on the substrate, and extending in a thickness direction of the substrate;
a wavelength conversion layer over the light-emitting element in the emission area, comprising a base resin, and a scatterer dispersed in the base resin, and configured to convert a wavelength of light emitted from the light-emitting element;
a light-blocking member on the partition wall;
at least one optical pattern on the wavelength conversion layer in the emission area, and having an upwardly protruding shape; and
a color filter on the optical pattern.

13. The display device of claim 12, wherein a refractive index of the optical pattern is greater than a refractive index of the color filter.

14. The display device of claim 13, wherein the color filter is between the optical pattern and the wavelength conversion layer.

15. The display device of claim 12,
wherein the partition wall comprises a first partition wall comprising a same material as the light-emitting element,
wherein the light-emitting element comprises a first semiconductor layer, an active layer on the first semiconductor layer, and a second semiconductor layer on the active layer,
wherein the partition wall further comprises a second partition wall on the first partition wall and comprising an insulating material, and a third partition wall on the second partition wall and comprising a conductive material, and
wherein a thickness of the second partition wall is greater than a thickness of the third partition wall.

16. A display device comprising:
a substrate;
a first emission area for emitting a first light, a second emission area for emitting a second light, and a third emission area for emitting a third light, which are in a display area;
a partition wall partitioning the first emission area, the second emission area, and the third emission area;

a first light-emitting element in the first emission area, a second light-emitting element in the second emission area, and a third light-emitting element in the third emission area, which extend in a thickness direction of the substrate;

a filling layer on, and surrounding sides of, the first, second, and third light-emitting elements;

a light-blocking member on the partition wall;

an optical pattern on the filling layer, and having a refractive index that is different from a refractive index of the filling layer; and a color filter covering the optical pattern.

17. The display device of claim 16, wherein the optical pattern is directly on the filling layer.

18. The display device of claim 16, further comprising a reflective film on side surfaces of the light-blocking member.

19. The display device of claim 16, wherein the optical pattern is in direct contact with the light-blocking member.

\* \* \* \* \*